US007863887B2

(12) United States Patent
Moriya et al.

(10) Patent No.: US 7,863,887 B2
(45) Date of Patent: Jan. 4, 2011

(54) STATE DETECTION DEVICE FOR DETECTING ABNORMAL OPERATION OF A HIGH-FREQUENCY MAGNETRON HEATING APPARATUS

(75) Inventors: Hideaki Moriya, Nara (JP); Nobuo Shirokawa, Nara (JP); Hauo Suenaga, Osaka (JP); Shinichi Sakai, Nara (JP); Manabu Kinoshita, Nara (JP)

(73) Assignee: Panasonic Corporation, Osaka (JP)

( * ) Notice: Subject to any disclaimer, the term of this patent is extended or adjusted under 35 U.S.C. 154(b) by 189 days.

(21) Appl. No.: 12/159,012

(22) PCT Filed: Dec. 26, 2006

(86) PCT No.: PCT/JP2006/325971

§ 371 (c)(1),
(2), (4) Date: Jun. 24, 2008

(87) PCT Pub. No.: WO2007/074843

PCT Pub. Date: Jul. 5, 2007

(65) Prior Publication Data

US 2009/0230949 A1 Sep. 17, 2009

(30) Foreign Application Priority Data

| | | | |
|---|---|---|---|
| Dec. 26, 2005 | (JP) | ............................ | 2005-372662 |
| Jun. 19, 2006 | (JP) | ............................ | 2006-169051 |
| Jun. 19, 2006 | (JP) | ............................ | 2006-169053 |

(51) Int. Cl.
*G01R 29/00* (2006.01)

(52) U.S. Cl. .................................... 324/120; 324/76.11

(58) Field of Classification Search ....................... None
See application file for complete search history.

(56) References Cited

U.S. PATENT DOCUMENTS

| | | | | |
|---|---|---|---|---|
| 4,210,795 A | | 7/1980 | Lentz | |
| 4,504,767 A | | 3/1985 | Levie et al. | |
| 4,843,202 A | * | 6/1989 | Smith et al. | 219/716 |
| 4,895,067 A | | 1/1990 | Ohji et al. | |
| 4,992,637 A | * | 2/1991 | Ishiyama | 219/716 |
| 5,021,620 A | * | 6/1991 | Inumada | 219/716 |
| 5,274,208 A | | 12/1993 | Noda | |
| 5,451,750 A | | 9/1995 | An | |
| 5,571,439 A | | 11/1996 | Daley et al. | |
| 5,695,671 A | | 12/1997 | Landwehr et al. | |
| 6,362,463 B1 | | 3/2002 | Bessyo et al. | |
| 7,064,305 B2 | * | 6/2006 | Lee | 219/702 |
| 2009/0001074 A1 | * | 1/2009 | Shirokawa et al. | 219/721 |

FOREIGN PATENT DOCUMENTS

EP 0 275 097 A2 7/1988

(Continued)

OTHER PUBLICATIONS

International Search Report Dated Feb. 27, 2007.

(Continued)

*Primary Examiner*—Vinh P Nguyen
(74) *Attorney, Agent, or Firm*—Pearne & Gordon LLP

(57) ABSTRACT

A device utilizing an operating state detection technique is provided which makes it possible to accurately detect an abnormality of a high-frequency heating apparatus.

10 Claims, 12 Drawing Sheets

FOREIGN PATENT DOCUMENTS

| | | |
|---|---|---|
| JP | 02-312182 | 12/1990 |
| JP | 03-295191 | 12/1991 |
| JP | 04-056092 | 2/1992 |
| JP | 04-084026 | 3/1992 |
| JP | 08-096947 | 4/1996 |
| JP | 10-172749 | 6/1998 |
| JP | 2000-227223 | 8/2000 |
| JP | 2001-257069 | 9/2001 |
| JP | 2003-243147 | 8/2003 |
| JP | 2006-222004 | 8/2006 |
| WO | 96/34512 A1 | 10/1996 |

OTHER PUBLICATIONS

European Search Report dated Jan. 4, 2010.

European Search Report for Appl. No. 10000037.1 dated Aug. 20, 2010.

European Search Report for Appl. No. 10000038.9 dated Aug. 20, 2010.

* cited by examiner

FIG. 7

BUFFER Z (shaded cell) ... UPDATED CONTENT

| | | SECTION 1 | SECTION 2 | SECTION 3 | SECTION 4 | SECTION 5 | SECTION 6 | SECTION 7 | SECTION 8 | SECTION 9 | SECTION 10 | | BUFFER X |
|---|---|---|---|---|---|---|---|---|---|---|---|---|---|
| FIRST REVOLUTION | SECTION 1 | 1 | 0 | 0 | 0 | 0 | 0 | 0 | 0 | 0 | 0 | | |
| | SECTION 2 | 1 | 2 | 0 | 0 | 0 | 0 | 0 | 0 | 0 | 0 | | |
| | SECTION 3 | 1 | 2 | 3 | 0 | 0 | 0 | 0 | 0 | 0 | 0 | | |
| | SECTION 4 | 1 | 2 | 3 | 4 | 0 | 0 | 0 | 0 | 0 | 0 | | |
| | SECTION 5 | 1 | 2 | 3 | 4 | 5 | 0 | 0 | 0 | 0 | 0 | | |
| | SECTION 6 | 1 | 2 | 3 | 4 | 5 | 6 | 0 | 0 | 0 | 0 | | |
| | SECTION 7 | 1 | 2 | 3 | 4 | 5 | 6 | 7 | 0 | 0 | 0 | | |
| | SECTION 8 | 1 | 2 | 3 | 4 | 5 | 6 | 7 | 8 | 0 | 0 | | |
| | SECTION 9 | 1 | 2 | 3 | 4 | 5 | 6 | 7 | 8 | 9 | 0 | | |
| | SECTION 10 | 1 | 2 | 3 | 4 | 5 | 6 | 7 | 8 | 9 | 10 | → | 55 |
| SECOND REVOLUTION | SECTION 1 | 11 | 2 | 3 | 4 | 5 | 6 | 7 | 8 | 9 | 10 | → | 65 |
| | SECTION 2 | 11 | 12 | 3 | 4 | 5 | 6 | 7 | 8 | 9 | 10 | → | 75 |
| | SECTION 3 | 11 | 12 | 13 | 4 | 5 | 6 | 7 | 8 | 9 | 10 | → | 85 |

STATE DETECTION DEVICE FOR DETECTING ABNORMAL OPERATION OF A HIGH-FREQUENCY MAGNETRON HEATING APPARATUS

TECHNICAL FIELD

The present invention relates to a technique for the high-frequency heating in an apparatus using a magnetron such as a microwave oven and, in particular, relates to a state detection device for detecting the operating state of a high-frequency heating apparatus.

BACKGROUND ART

FIG. 13 is a diagram showing the configuration of a microwave oven as an example of the high-frequency heating apparatus. In the figure, the AC power from a commercial power supply 11 is rectified into a DC current by a rectifying circuit 13, then smoothed by a choke coil 14 and a smoothing capacitor 15 of the output side of the rectifying circuit 13 and applied to the input side of an inverter 16. The DC current is converted into a current of a desired high-frequency (20 to 40 kHz) by the on/off operation of the semiconductor switching elements within the inverter 16. The inverter 16 is controlled by an inverter control circuit 161 for driving and controlling the semiconductor switching elements which switch the current at a high speed, whereby a current flowing in the primary side of a boosting transformer 18 is switched in on/off states at a high speed.

The input current to the control inverter control circuit 161 is detected by detecting the primary current of the rectifying circuit 13 by a current transformer 17. The detected current is inputted into the inverter control circuit 161 and used for controlling the inverter 16. A temperature sensor (thermistor) 9' is attached to a radiation fin for cooling the semiconductor switching elements. Temperature information detected by the temperature sensor is inputted into the inverter control circuit 161 and used for controlling the inverter 16.

In the boosting transformer 18, a primary winding 181 is applied with a high-frequency voltage outputted from the inverter 16 and a secondary winding 182 is applied with a high voltage in accordance with a winding ratio. A winding 183 having a small number of turns is provided at the secondary side of the boosting transformer 18 in order to heat the filament 121 of a magnetron 12. The secondary winding 182 of the boosting transformer 18 is provided with a voltage doubler rectifying circuit 19 for rectifying the output of the secondary winding. The voltage doubler rectifying circuit 19 is configured by a high-voltage capacitor 191 and two high-voltage diodes 192, 193.

When a microwave oven thus configured is operated in a state that a subject to be heated is not contained within a heating chamber at all or in a small heating load state, the temperature of the magnetron increases due to the back bombardment of the microwave and so ebm reduces. As a result, an anode current increases to thereby cause an overheating state due to a so-called empty heating or the small heating load, and so the temperature of the magnetron and the high-voltage diodes may increase largely than the normal state. If such a state is ignored, the magnetron and the high-voltage diodes may be broken by the heat.

As a method of preventing such a trouble, there is a method in which a thermistor for detecting the temperature is placed near the magnetron, the semiconductor switching elements, the high-voltage diodes etc. and the device is stopped to prevent the increase of the temperature before the thermal breakage of these parts thereby.

As a method of preventing the temperature increase, for example, Patent Document 1 discloses a method in which a thermistor is fastened to a radiation fin by means of a screw to thereby detect the temperature from the radiation fin (see Patent Document 1).

FIG. 14A shows the attachment method described in Patent Document 1 and also shows a state that the thermistor is fastened to the radiation fin by means of the screw. The radiation fin 7 for heat radiation is attached on a printed board 6, and the thermistor 9' is attached just above a semiconductor switching element 8 attached near the radiation fin 7.

The heat radiation portion of the semiconductor switching element IGBT8 generating high heat is fixed to the radiation fin 7. The three legs of the element are inserted into the through holes of the printed board 6 and soldered on the opposite side of the board. The thermistor 9' is also fastened to the radiation fin 7 by the screw and takes out the temperature information of the radiation fin 7.

Further, there is a method of attaching a radial thermistor near a semiconductor switching element of a printed board (see a patent document 2). FIG. 14B is a diagram showing the attachment method of Patent Document 2.

In this figure, a radiation fin 7 for heat radiation is attached on a printed board 6, and a semiconductor switching element 8 is attached in adjacent to the radiation fin 7. A thermistor 9' is attached so as to oppose to the semiconductor switching element 8 via the fin.

Patent Document 1; JP-A-2-312182

Patent Document 2: Japanese Patent No. 2892454

DISCLOSURE OF THE INVENTION

Problems that the Invention is to Solve

According to the method of Patent Document 1, there is a problem that since the fastening procedure using the screws to the radiation fin is required, the total number of the assembling procedures increases and so the cost of the device increases. Further, the detected temperature does not directly represent the temperature of the high-voltage diode but represents the temperature of the radiation fin to which the semiconductor switching element is attached. Thus, although there is a correlation between the temperature increase of the high-voltage diode and that of the semiconductor switching element, there is a drawback that each of the temperature detection accuracy and sensitivity is not good.

According to the method of Patent Document 2, there are drawbacks that the number of the assembling procedures increases since the thermistor is attached later near the radiation fin and the thermal time constant of the thermistor degrades since it is directly influenced by cooling wind. Further, the detected temperature does not directly represent the temperature of the high-voltage diode but represents the temperature of the radiation fin to which the semiconductor switching element is attached. Thus, although there is a correlation between the temperature increase of the high-voltage diode and that of the semiconductor switching element, there is a drawback that each of the temperature detection accuracy and sensitivity is not good.

Further, the thermistor 9' is tried to be attached to a portion A near the leg portions of the semiconductor switching element 8. However, in this case, also there are drawbacks that the number of the assembling procedures increases since the thermistor is attached later manually near the radiation fin and the thermal time constant of the thermistor degrades since it is directly influenced by cooling wind. Further, the detected temperature does not directly represent the temperature of the high-voltage diode but represents the temperature of the radiation fin to which the semiconductor switching element is attached. Thus, although there is a correlation between the temperature increase of the high-voltage diode and that of the semiconductor switching element, there is a drawback that each of the temperature detection accuracy and sensitivity is not good.

Although the aforesaid techniques of the related arts do not focus on the improvement for the protection of the high-voltage diode from the thermal breakage, the temperature detection accuracy and sensitivity is not good. Further, when the microwave oven is operated in a state that a subject to be heated is not contained within a heating chamber at all or in a small heating load state, the temperature increasing amount of the magnetron and the high-voltage diode becomes larger than the temperature increasing amount of the other constituent parts. Thus, the temperature increase can not be detected accurately and so there is a possibility that the parts are broken, these techniques can not be employed.

The invention provides a technique which can accurately determine and recognize the operating state of a high-frequency heating apparatus and detect an abnormal operating state such as an empty heating state or an overheating state thereby to protect respective constituent parts and the high-frequency heating apparatus.

Means for Solving the Problems

The invention provides a state detection device for detecting the operating state of a high-frequency heating apparatus having a magnetron for generating a microwave. The device includes: an anode current input portion which inputs a detected anode current of the magnetron; and a determination portion which reads a corresponding value corresponding to the anode current inputted by the anode current input portion for a plurality of times during a predetermined time period and determines the operating state of the high-frequency heating apparatus based on a plurality of the corresponding values, wherein the determination portion determines the operating state of the high-frequency heating apparatus based on at least one of (1) a threshold value control based on the number of times where the corresponding value larger than a predetermined threshold value is read continuously and (2) a changing value detection control based on a changing value per unit time of the corresponding value calculated by the reading of plural times.

When the number of times reaches a predetermined number of times or more in (1) the threshold value control or when the changing value exceeding a predetermined threshold value is calculated for a predetermined number of times or more in (2) the changing value detection control, the determination portion determines that the operating state of the high-frequency heating apparatus is not normal to stop an operation of the high-frequency heating apparatus or reduce an output thereof.

Further, the anode current input portion can be configured by an A/D converter terminal which subjects an anode voltage that is the corresponding value to an analog-to-digital conversion.

The determination portion determines whether the operating state of the high-frequency heating apparatus is a normal state, an empty heating state or an overheating state by a load based on the changing value under (2) the changing value detection control. In this respect, a buzzer device may be provided which warns the empty heating state and the overheating state by different buzzer sounds, respectively.

Further, the state detection device may control high-frequency heating apparatus in a manner that the (2) the changing value detection control is performed when the number of times does not exceed the predetermined number of times in (1) the threshold value control.

The high-frequency heating apparatus includes the magnetron, an anode current detection portion which detects the anode current, an inverter portion which controls the magnetron, and the aforesaid state detection device. The anode current detection portion can be configured by an anode current detection resistor which is disposed in a path (anode current path) for grounding the inverter portion. Further, the state detection device may output a command to the inverter portion for making the anode current constant when it is determined that the operating state of the high-frequency heating apparatus is not normal.

Further, the invention provides a state detection method for detecting an operating state of a high-frequency heating apparatus including a magnetron for generating microwave. The method includes: a step of inputting a detected anode current of the magnetron; and a step of reading a corresponding value corresponding to the anode current thus inputted for a plurality of times during a predetermined time period and determining the operating state of the high-frequency heating apparatus based on a plurality of the corresponding values, wherein the determination step determines the operating state of the high-frequency heating apparatus based on at least one of (1) a threshold value control based on the number of times where the corresponding value larger than a predetermined threshold value is read continuously and (2) a changing value detection control based on a changing value per unit time of the corresponding value calculated by the reading of a plural times.

Further, the invention provides a state detection device for detecting an operating state of a high-frequency heating apparatus including a magnetron for generating microwave. The state detection device includes: a motion position determination portion which determines a motion position of a radio wave stirring member that operates periodically in order to relatively stir the microwave generated by the magnetron with respect to a heated subject; an anode current input portion which inputs a detected anode current of the magnetron; and a determination portion which determines one period of a periodical motion of the radio wave stirring member from information of the motion position determined by the motion position determination portion, then reads a corresponding value corresponding to the anode current inputted from the anode current input portion for a plurality of times during the one period and determines the operating state of the high-frequency heating apparatus based on a plurality of the corresponding values during the one period.

According to the state detection device of the invention, the operating state of the high-frequency heating apparatus can be determined after the anode current of the magnetron and the corresponding value thereof are read in relation to the operation of the radio wave stirring member which may influence on these values. Thus, it becomes possible to consider the influence on the anode current and the corresponding value thereof by the operation of the radio wave stirring member, whereby it becomes possible to prevent erroneous detection of the operating state due to noise or the fluctuation of feeding distribution.

Further, the determination portion for determining the operating state can determine the operating state of the high-frequency heating apparatus based on a summed value during one period which is a total sum of the plurality of the corresponding values during the one period. In particular, the determination portion for determining the operating state is desirably configured so as to calculate an average value of one section representing an average value of the corresponding values at each of a plurality of the sections which are obtained by dividing the one period of the radio wave stirring member equally in time, then store the average value of one section for each of the respective sections in a storage device, then when a summed value during one period which is a total sum of the average values of respective sections during one period is calculated, serially update the average value of one section previously stored in the storage device among the average values of respective sections constituting the summed value during one period thus calculated.

By employing the summed value during one period which is the total sum during the one period, the influence of the instantaneous change can be suppressed also in corresponding to the change of the feeding distribution by the radio wave stirring member. Further, since the summed value is employed, the determination portion for determining the operating state can use a value obtained by enlarging a fine IaDC value. Thus, the operating state of the high-frequency heating apparatus can be surely recognized without being influenced by noise.

The determination portion for determining the operating state can determine the operating state of the high-frequency heating apparatus based on a threshold control according to the number of times where the summed value during one period larger than a predetermined threshold value is read continuously.

On the other hand, the determination portion for determining the operating state can be arranged to determine the operating state of the high-frequency heating apparatus based on a changing value detection control according to a changing value of the summed value during one period calculated by the reading of plural times.

In the high-frequency heating apparatus using the aforesaid state detection device, the radio wave stirring member is configured by a rotary antenna or a radio wave diffusion blade which stirs the microwave itself. Alternatively, the radio wave stirring member can be configured by a turn table which rotates the heated subject to thereby relatively stir the microwave generated by the magnetron with respect to the heated subject. The invention is applicable to the high-frequency heating apparatus of both types.

Further, the invention also provides a state detection method for detecting an operating state of a high-frequency heating apparatus including a magnetron for generating microwave. The state detection method includes: a step of determining a motion position of a radio wave stirring member which operates periodically in order to relatively stir the microwave generated from the magnetron with respect to a heated subject; a step of inputting a detected anode current of the magnetron; a step of determining one period of a periodical motion of the radio wave stirring member from information of the determined motion position determined by the motion position determining portion; and a step of reading a corresponding value corresponding to the anode current inputted from the anode current inputting portion for a plurality of times during the one period and determining the operating state of the high-frequency heating apparatus based on a plurality of the corresponding values during one period. Further, the invention also includes a program for executing the method.

Further, the invention provides a state detection device for detecting an operating state of a high-frequency heating apparatus including a magnetron for generating microwave. The state detection device includes: an anode current input portion which inputs a detected anode current of the magnetron; and a determination portion which reads the anode current inputted by the anode current input portion and determines the operating state of the high-frequency heating apparatus based on the anode current, wherein the determination portion receives an output control signal for controlling an output of the magnetron and changes a threshold value for determining the state in accordance with a value of the output control signal.

According to the state detection device of the invention, it is possible to change a threshold value as a determining criterion for determining the operating state of the high-frequency heating apparatus in accordance with the output control of the magnetron. Since the threshold value is set suitably in accordance with the output, a boundary between the abnormal operation and the normal operation changing depending on the ambient temperature and the setting condition where the high-frequency heating apparatus is placed and the kind of the heated subject etc. can be clearly defined, whereby it becomes possible to prevent the erroneous detection of the operating state.

The threshold value is considered to be a threshold value with respect to a predetermined corresponding value itself of the output control signal. In this respect, the determination portion is configured to determine that, when the corresponding value of the output control signal thus inputted exceeds the threshold value, the operating state of the high-frequency heating apparatus is not normal to thereby stop an operation of the high-frequency heating apparatus or reduce an output thereof.

On the other hand, the threshold value may be a changing value threshold value with respect to a changing value according to a time lapse of the predetermined corresponding value of the output control signal. Further, the determination portion may provide an effective determination time for determining the changing value and change also the effective determination time. In this respect, the determination portion is configured to determine, when the changing value of the output control signal thus inputted exceeds the changing value threshold value, that the operating state of the high-frequency heating apparatus is not normal to thereby stop an operation of the high-frequency heating apparatus or reduce an output thereof.

The corresponding value is desirably an anode voltage obtained by converting the anode current. In this case, the anode current input portion is desirably constituted by an A/D converter terminal which subjects the anode voltage to an analog-to-digital conversion.

When the aforesaid state detection device is incorporated into the high-frequency heating apparatus, the reliability of the high-frequency heating apparatus can be improved. Further, the anode current detection portion can be simply configured by an anode current detection resistor which is disposed in a path for grounding the inverter portion.

Further, the invention also provides a state detection method for detecting an operating state of a high-frequency heating apparatus including a magnetron for generating microwave. The state detection method includes: a step of inputting a detected anode current of the magnetron;

a step of reading an anode current inputted by the anode current input portion and determining the operating state of the high-frequency heating apparatus based on the anode current; and a step of changing a threshold value for determining the state in accordance with a value of the output control signal. The invention includes a program for executing the method by a computer.

EFFECTS OF THE INVENTION

According to the invention, the anode current of the magnetron in the high-frequency heating apparatus is detected and the operating state of the high-frequency heating apparatus is determined based on the anode current thus detected. Further, since the current is measured not by detecting only an instantaneous value thereof but by detecting a plural number of times, the erroneous detection due to noise etc. can be prevented and the operating state can be detected accurately. Further, when the operating state is not normal, the abnormal state such as the empty heating and the overheating can be detected.

Further, at the time of detecting the operating state of the high-frequency heating apparatus based on the detection of the anode current of the magnetron, it becomes possible to prevent the erroneous detection due to the change of the instantaneous anode current caused by the change of the feeding distribution and the erroneous detection due to noise etc., whereby the operating state can be detected accurately. Further, since the threshold value used for a various kind of determinations is made variable in correspondence to the change of the output of the magnetron, the operating state can be detected accurately also in a combination of a different setting condition, a different output and a different heated subject.

BRIEF DESCRIPTION OF THE DRAWINGS

FIG. 7 A conceptional diagram showing a state where detection data is stored and updated by a buffer memory.

EXPLANATION OF SYMBOLS

Figure 1:
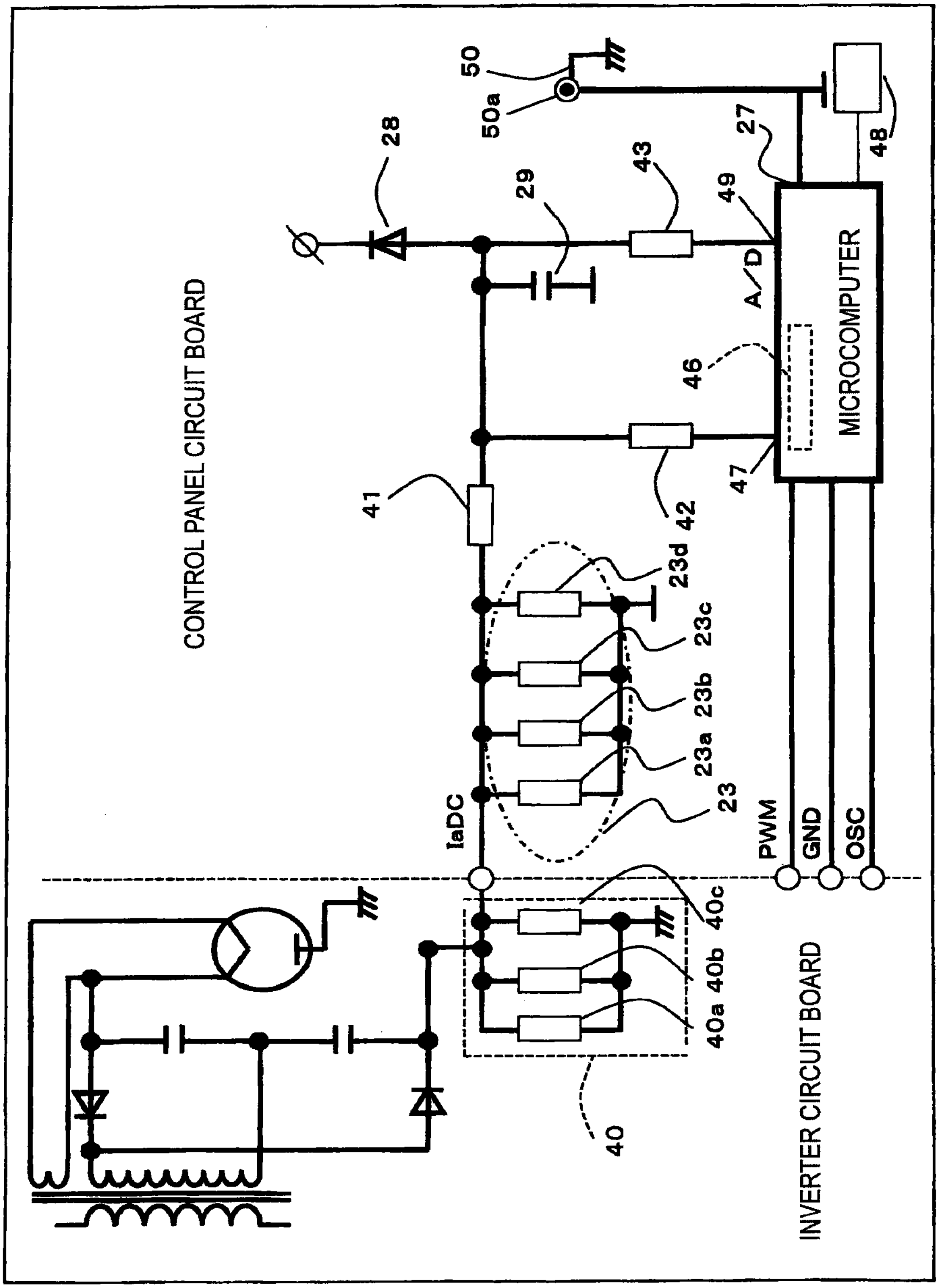
FIG. 1 A diagram showing a high-frequency heating apparatus according to an embodiment of the invention and in particular showing the configuration of a portion relating to the state detection device of the high-frequency heating apparatus.

12 magnetron
23 protection element (resistor)
27 microcomputer
29 capacitor
40 anode current detection resistor
41, 42, 43 resistor
46 three-state output circuit
47 three-state terminal
48 buzzer
49 A/D converter terminal
50 grounding line
63 wave guide
64 heating chamber
65 mounting table
66 heated subject housing space
67 antenna space
68, 69 rotary antenna
70, 71 motor
80 rotary position determination portion
82 operation input portion
100 high-frequency heating apparatus (microwave oven)

BEST MODE FOR CARRYING OUT THE INVENTION

Hereinafter, embodiments of the invention will be explained in detail with reference to drawings.

First Embodiment

FIG. 1 is a diagram showing a high-frequency heating apparatus such as a microwave oven according to the embodiment of the invention and in particular showing the configuration of a portion relating to the detection of an operating state thereof. In FIG. 1, the AC power from a commercial power supply is rectified into a DC current by a rectifying circuit, then smoothed by a smoothing circuit configured by a choke coil and a smoothing capacitor of the output side of the rectifying circuit and applied to the input side of an inverter. The DC current is converted into a current of a desired high-frequency (20 to 40 kHz) by the on/off operation of the semiconductor switching elements of the inverter. The inverter is driven by an inverter control circuit for controlling the semiconductor switching elements which switch the DC current at a high speed, whereby a current flowing in the primary side of a boosting transformer is switched in on/off states at a high speed. In the boosting transformer, a primary winding is supplied with a high-frequency voltage outputted from the inverter and so a high voltage according to the winding ratio of the transformer is obtained at the secondary winding thereof. A winding having a small number of turns is provided at the secondary side of the boosting transformer in order to heat the filament of a magnetron. The output of the boosting transformer is rectified by a full-wave voltage doubler rectifying circuit coupled to the secondary winding and then a DC high voltage is applied to the magnetron. The full-wave voltage doubler rectifying circuit is configured by two high-voltage capacitors and two high-voltage diodes. The basic configuration on the circuit board of the inverter explained above constitutes a part of the high-frequency heating apparatus according to the invention. This basic configuration is omitted in the drawing since it is same as the entire configuration shown in FIG. 4 (except for the temperature sensor 9'). That is, the omitted portion includes at least the magnetron and the inverter portion (including the inverter 16, the inverter control circuit 161 etc. of FIG. 4) for controlling the magnetron. The aforesaid portions are basically disposed on the circuit board of the inverter housed within the casing of the high-frequency heating apparatus.

Further, on the circuit board of the inverter, a detection resistor 40 for detecting an anode current serving as an anode current detection portion for detecting the anode current of the magnetron is inserted between the ground of the circuit board of the inverter and the magnetron, the cathode side of the high-voltage diode. The anode current detection resistor 40 is configured by a plurality of resistor elements 40*a*, 40*b*, 40*c* (three in this case) connected in parallel by taking the breakage etc. of the resistors into consideration. Another element may be employed as the anode current detection portion so long as the element can detect the current following into the anode.

At the time of operating the high-frequency heating apparatus, when a high voltage is applied to the magnetron, a microwave is outputted. In this case, it is known that the anode current becomes larger as the output of the high-frequency heating apparatus increases. Further, it is known that the degree of the reflection of the microwave becomes large so that the anode current becomes large, when a load within the heating chamber of the apparatus is small or the apparatus is in the empty heating state that a subject to be heated is not contained within the chamber. That is, by detecting the anode current flowing into the anode current detection resistor 40, the operating state of the high-frequency heating apparatus, in particular, the abnormal operating state such as the empty heating or the overheating can be recognized. Thus, the operating state of the apparatus can be controlled by inputting the detected current into a microcomputer 27 on a control panel board described later.

Next, the explanation will be made as to a portion disposed on a control panel circuit board which is housed within the casing of the high-frequency heating apparatus like the inverter circuit board and is configured as a board separately provided from the inverter circuit board. The current detected by the detection resistor 40 is transmitted from the inverter circuit board to a communication line IaDC coupled to the inverter circuit board via the connector, then smoothed by a low-pass filter which is configured by an input resistor 41 and a capacitor 29 and acts to remove high-frequency noise, and inputted to the A/D converter terminal 49 of the microcomputer 27.

A protection resistor 23 is coupled between the output line (apart of the communication line IaDC) from the detection resistor 40 and the ground of the control panel circuit board, in the pre-stage of the low-pass filter. The protection resistor 23 is provided in order to prevent a high voltage from being applied to the microcomputer 27 when the part on the inverter circuit board side is placed in an abnormal state (for example, all the resistor elements 40*a*, 40*b* and 40*c* are broken). Like the detection resistor 40, the protection resistor 23 is configured by a plurality of resistor elements 23*a*, 23*b*, 23*c*, 23*d* (four connected in parallel) connected in parallel in order to realize the safety more surely. In place of the protection resistor 23, a plurality of 1 A diodes may be connected in series (to a degree not influencing on the actual measurement of IaDC).

In this case, a circuit protection diode 28 is not required.

Further, a protection resistor 43 and the diode 28 for preventing the erroneous operation and protecting the circuit are inserted between the A/D converter terminal 49 of the microcomputer 27 and a Vcc power supply. The microcomputer 27 is coupled to a grounding line 50 which is grounded to the main body (casing) of the high-frequency heating apparatus via metal fixing members 50*a* such as pins and screws on the control panel circuit board. That is, there is employed a configuration that the grounding to the control panel circuit board is realized only by the grounding line 50. According to this configuration, since the path of the anode current of the magnetron as a detection subject described later becomes one, an error detection in the case where the grounding line is out of connection can be performed easily.

According to the invention, before operating the apparatus, the grounding floating of each of the inverter circuit board and the control panel circuit board is checked by using a three-state output circuit 46 contained in the microcomputer 27. The three-state output circuit 46 checks the grounding by using the voltage value obtained at the A/D converter terminal 49 as a high output by a loop configured by the anode current detection resistor 40, the protection resistor 23 and the resistors 41, 42. When it is confirmed that the coupling is secured, the three-state output circuit 46 is opened and electrically separated from a series of the circuits. Then, only in the case of the normal state, a PWM output command is sent to the inverter control circuit on the inverter circuit board side via a communication line (PWM) to thereby start the operation of the inverter. On the other hand, when the occurrence of the floating is detected in at least one of the boards by the grounding check using the output of the three state output circuit, an error is displayed and the operation of the apparatus is inhibited. Another communication line OSC is a connector for receiving a signal representing the operation state of the inverter from the inverter control circuit. A portion represented by GND constitutes a coupling line to the grounding pattern of the control panel circuit board.

Further, the microcomputer 27 is coupled to a buzzer 48 which operates at a predetermined timing in accordance with a command from the microcomputer 27. The parts may be distributed arbitrarily to the inverter circuit board and the control panel circuit board and the distribution method is not limited to the example shown in the figure.

The distribution of the respective parts to the inverter circuit board and the control panel circuit board shown in FIG. 1 and in the aforesaid description represents merely one example and the distribution method thereof does not relate to the essence of the invention. However, in general, the major driving circuits for the apparatus such as the inverter circuit and the inverter control circuit are formed on the inverter circuit board and coupled to the magnetron. The control circuit such as the microcomputer is formed on the control panel circuit board. In particular, the control circuit serves to command cooking menus when the apparatus is a microwave oven.

The explanation will be made with reference to a flowchart shown in FIG. 2 as to the operation at the time of detecting the operating state of the high-frequency heating apparatus thus configured, in particular, at the time of detecting an abnormality in the operating state when the apparatus is a microwave oven and the operation of the protecting processing at the time of detecting the abnormality. According to the invention, as described above, the operating state of the high-frequency heating apparatus is recognized by detecting the anode current of the magnetron. In this case, the current is not measured by detecting an instantaneous value thereof once but is detected for a plural number of times during a predetermined time. That is, it is intended to secure the detection with a higher accuracy by detecting the plural number of times.

First, the microcomputer 27 sets n=0, m=0, k=0 and Z(m)=1.2 as the initial setting of the high-frequency heating apparatus (step S100). The meanings of the respective signs are as follows.

n: the number of times that the value of an anode voltage (a value corresponding to the anode current) IaDC becomes equal to or larger than a predetermined threshold value A described later.

m: the order where the anode voltage is read after it is determined that the anode voltage IaDC is smaller than the predetermined threshold value A.

Z(m): the anode voltage read in the m-th time.

k: after a difference (changing value) between the anode voltage Z(m) read in the m-th time and the anode voltage Z(m−1) read in the (m−1)-th time becomes larger than a predetermined threshold value C, the number of times that the difference is read.

Although, Z(m) represents the anode voltage value itself thus read, it is set to be 1.2 volt as a provisional voltage value at the time of starting the operation. That is, Z(0)=1.2.

The microcomputer 27 sends the PWM command to the inverter control circuit via the PWM communication line to thereby drive the magnetron, whereby an operating state monitoring sequence based on the checking of the anode current and the anode voltage is started (step S101). Next, the anode current read by the anode current detection resistor 40 is inputted into the A/D converter terminal 49 of the microcomputer 27 constituting an anode current input portion, whereat the anode current is subjected to the analog-to-digital conversion and also the corresponding anode voltage IaDC is read (step S102). This conversion from the current to the voltage is performed in view of the value of the anode current detection resistor 40, according to the usual method. Then, the microcomputer 27 compares the IaDC value thus read with the threshold value A (a threshold voltage value for determining whether or not an abnormality such as the empty heating occurs) to thereby determine whether or not the read value is lower than the threshold value A (step S103).

Figure 3:
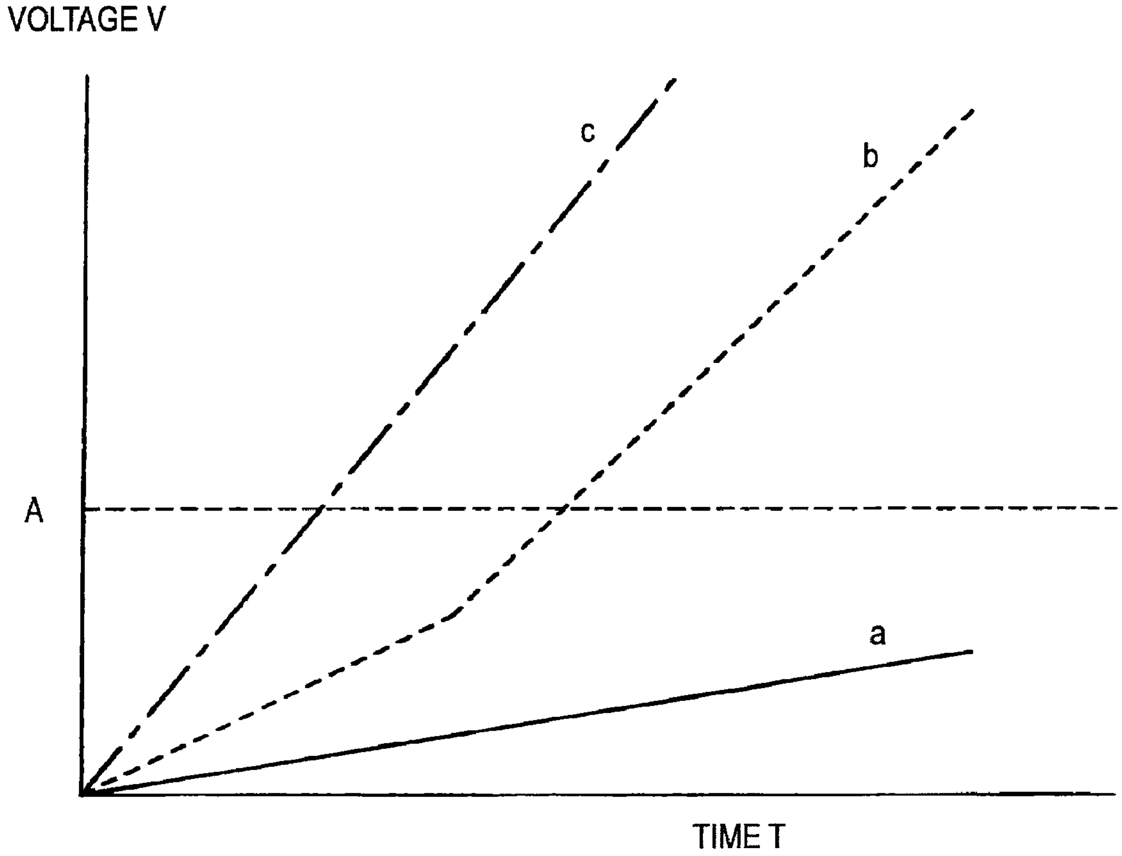
FIG. 3 A diagram showing respective curves of the detected voltage value in three operating states.

The threshold value A can be determined with reference to a characteristic diagram between the anode voltage and the time shown in FIG. 3, for example. When each of the operating state and the heating temperature within the chamber is normal, the voltage increases at a constant rate with the time lapse as shown by a curve a. In contrast, when the apparatus is operated in the empty heating state that a subject to be heated is not contained within the chamber at all, the temperature of the magnetron increases abruptly from the start of the heating and also the voltage reaches a dangerous region exceeding the threshold value A in a short time as shown by a curve c. Further, in the case of a food of a small heating load or a small quantity of drink etc., although the slope of the curve is gentle while water of the load exists, the voltage increases abruptly with a slope similar to that in the case of the empty heating after a phenomenon occurs that the water has evaporated due to the over heating. A suitable value of the threshold value A can be set by experimentally obtaining such characteristic curves in advance. Of course, the threshold value A is not limited particularly since it varies depending on the setting value, the operating condition, the values of the parts such as the resistors. Such the control based on the predetermined threshold value with respect to the absolute value of the voltage is called the threshold value control.

Figure 2:
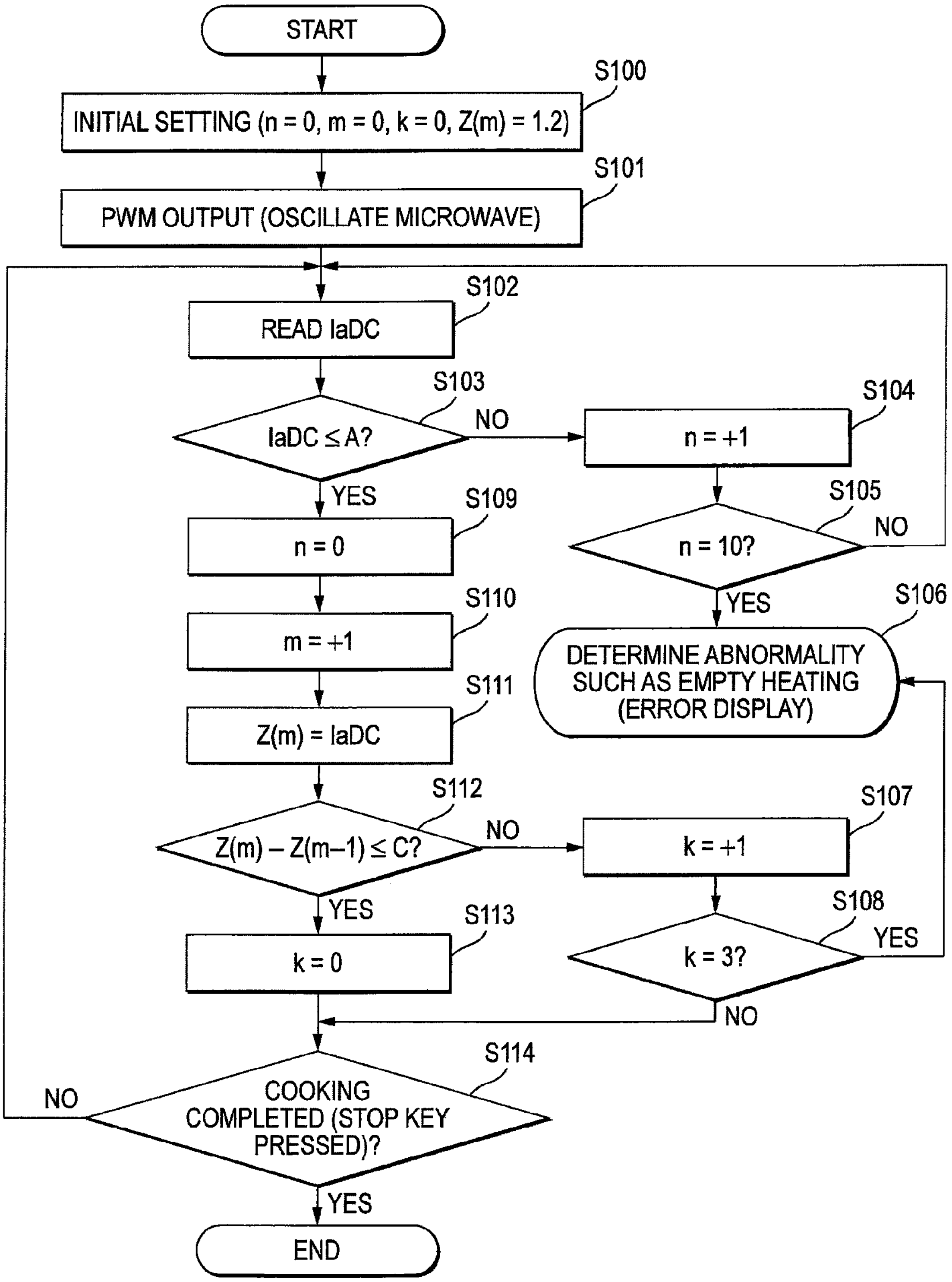
FIG. 2 A flowchart of the processing of the state detection device.

Returning to the flowchart shown in FIG. 2, when it is determined that IaDC is larger than A, that is, the anode voltage IaDC is lager than the threshold value A as the result of the determination in step S103 (No in step S103), +1 is added to the check number of times n of a counter provided separately (step S104). Then, it is determined whether or not the check number of times n reaches 10 (step S105). When it is determined that the check number of times does not reach 10 (No in step S105), the process returns to the determining process of step S102, and the microcomputer 27 repeats the IaDC check loop of steps S102 to S105. On the other hand, when it is determined that n reaches 10 (Yes in step S105), the microcomputer 27 determines that any abnormality occurs. Then, the microcomputer stops the apparatus or reduces the output of the apparatus and displays the error via a liquid crystal panel etc. provided at the casing of the apparatus.

That is, according to the invention, the apparatus is not stopped or the output of the apparatus is not reduced merely depending on the read value of the anode voltage at a certain instantaneous time point (only once). The microcomputer 27 continuously detects the IaDC values and stops the apparatus or reduces the output of the apparatus when it is continuously detected for the predetermined number of times or more in total that the IaDC value exceeds the threshold value A. Since such the control does not depend on the detection of only the instantaneous value, the probability of the error detection etc. due to noise can be reduced and so the detection operation can be performed more accurately The aforesaid expression "when it is continuously detected for the predetermined number of times or more" may be replace by another expression "when a predetermined time or more lapse". To be concrete, when a time period of the sampling detection is 100 ms, since n=10 in this example, the microcomputer 27 stops the apparatus or reduces the output of the apparatus when the state of IaDC>A continues one second or more (100 ms·10).

Returning again to the flowchart shown in FIG. 2, when it is determined to be IaDC≦A in step S103 (Yes in step S103), the detection number of times n for the threshold value control is set to be 0 (step S109) and the process proceeds to a changing value detection control for detecting the changing value of the anode voltage within a predetermined unit time period. First, 1 is added to a counter which counts the detection number of times of the anode voltage used for the changing value detection control, that is, an order number m representing that this is the m-th detection of the anode voltage after the control shifts to the changing value detection control (step S110). The IaDC value Z(m)=IaDC read at this time is written (step S111). Then, it is determined whether or not a difference between the value Z(m) and a previously detected value Z(m−1), that is, a changing value Z(m)−Z(m−1) exceeds a threshold value C of the changing value in the changing value detection control (step S112).

When the changing value is larger than the threshold value C (No in step S112), 1 is added to a value k of a counter which represents the number of times that the changing value exceeds the threshold value C (step S107). Then, it is determined whether or not the number reaches three (step S108). When it is determined that the number reaches three (Yes in step S108), the microcomputer 27 determines that there occurs any abnormality and so stops the apparatus or reduces the output of the apparatus and further displays the error (step S106).

When it is determined that the changing value is smaller than the threshold value C in step S112, that is, Z(m)−Z(m−1)≦C (Yes in step S112), the value k of the counter is set to 0 (step S113) and it is determined whether or not the cooking is completed (a stop key is pressed or not) (step S114). Also, when it is determined that k does not reach 3 in step S108 (No in step S108), it is determined whether or not the cooking is completed (step S114). When it is determined that the cooking is completed (Yes in step S114), the cooking is terminated. When it is not determined that the cooking is completed (No in step S114), the process returns to step S102 and the anode voltage value IaDC is read again.

In this manner, in the changing value detection control for detecting the change of the voltage during the constant time, a changing value per unit time of the A/D converted value read at the A/D converter terminal is monitored. For example, in the case of the empty heating, since the anode current increases abruptly after the starting, the changing value is large and so the slope of the curve is steep. Thus, by detecting such a phenomenon, it becomes possible to perform a safety countermeasure such as the stop or the output reduction in advance. In the case of the small heating load, the temperature abruptly changes finally. However, the cooking temperature changes gradually at first and changes with the lapse of time, which can be distinguished from a state where the empty heating is performed from the start. This is clear from the graph shown in FIG. 3. The graph shown in FIG. 3, in particular, the slopes of the respective curves can be applied to the changing value detection control.

As the method for detecting the operating state, as described above, the embodiment employs two control methods, that is, the threshold value control which uses the threshold value A as an absolute value of the voltage and the changing value detection control which detects the changing value of the voltage during the predetermined time. In FIG. 2, after the IaDC reading in step S102, the determination from step S103 corresponds to the threshold value control, and the determination from step S111 corresponds to the changing value detection control. These control methods are executed by a determination portion which is contained in the microcomputer 27 and constituted by various kinds of arithmetic processing devices. The microcomputer 27 including the determination portion and the A/D converter terminal 49 constituting the anode current input portion corresponds to the state detection device according to the invention. Of course, the determination portion and the anode current input portion are not necessarily constituted as a single chip integrally.

In the aforesaid embodiment, although the two methods, that is, the threshold value control and the changing value detection control are used together, these two methods may be executed independently. For example, the high-frequency heating apparatus can be controlled only by the threshold value control in a manner that after the threshold value control from step S102 to step S106 of FIG. 2 where the detection is performed by using the threshold value, the determination of step S114 is executed without executing steps S109 to S113. Alternatively, the high-frequency heating apparatus can be controlled only by the changing value detection control in a manner that after the changing value detection control from step S109 to S113 where the detection is performed by using the changing value, the determination of step S114 is executed without executing steps S102 to step S106.

In the aforesaid embodiment, although the time period of the sampling detection is set to 100 ms and the detection number of times n and k for the threshold value are set to 10 and 3, respectively, of course these values are not limited to particular values.

Further, when it is determined that the operating state is abnormal by the threshold value control and/or the continuous detection control, an alarm may be sounded by the buzzer 48 shown in FIG. 1 together with the stop of the operation or the reduction of the output or in place of the stop of the operation or the reduction of the output. The sound of the buzzer may be changed between the empty heating operation and the small heating load operation.

Further, although the anode voltage value IaDC exhibits different values depending on the operating state such as the empty heating, the small heating load and a large heating load, the fixed values A, C are used as the threshold value of the voltage and the changing value per unit time in this embodiment, respectively. These values may be changed depending on the difference of the operating state.

In the case of reducing the output of the high-frequency heating apparatus, it is desirable to reduce the output to 50% or less of the maximum output thereof. Only in view of the protection of the high-voltage diode of the full-wave voltage doubler rectifying circuit, the output may be restored to the normal 100% output when the anode voltage value IaDC reduces to the current corresponding to the threshold value A again, for example.

Second Embodiment

Next, the second embodiment according to the invention will be explained in detail with reference to the drawings.

Figure 4:
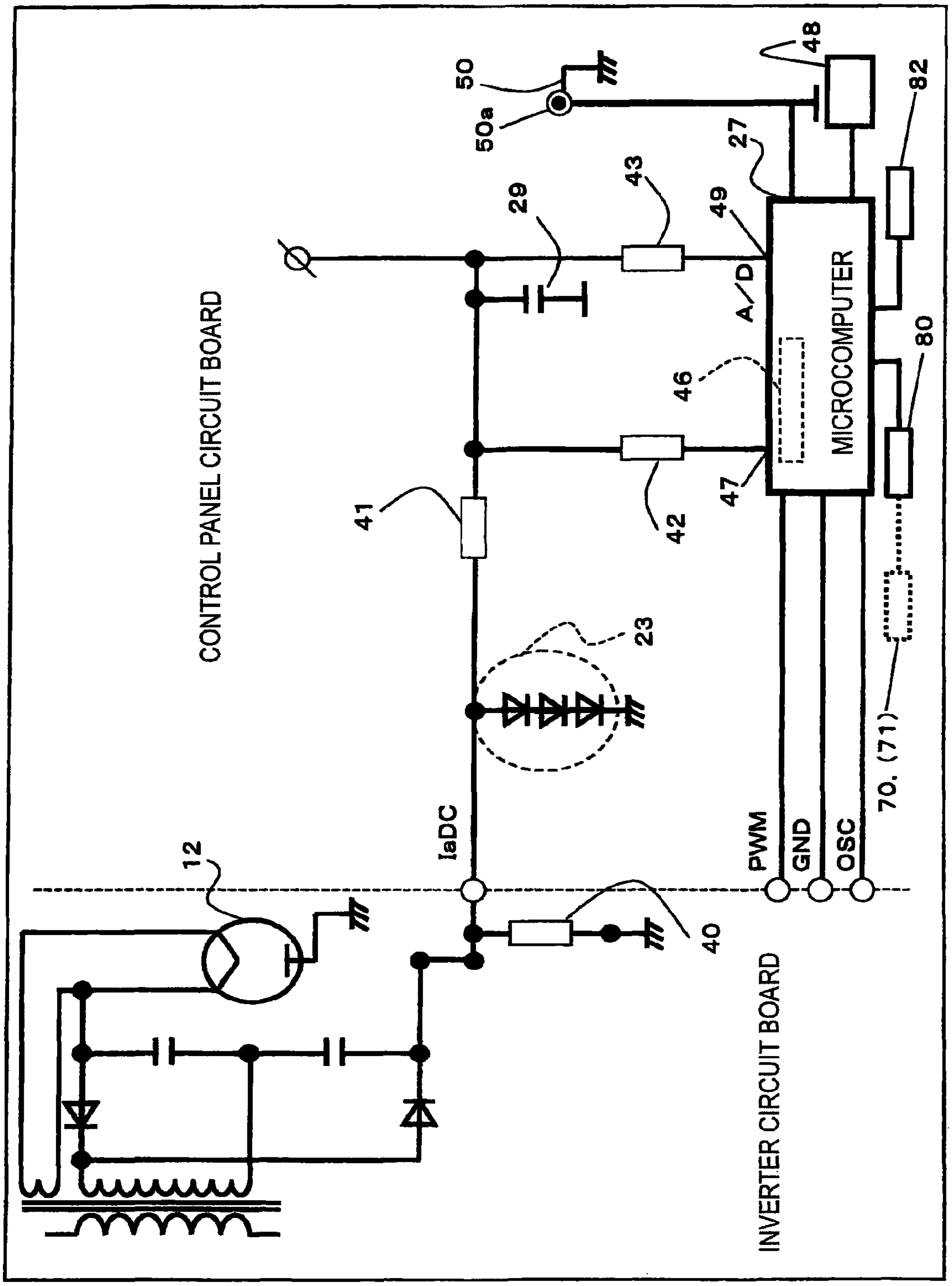
FIG. 4 A circuit diagram showing a high-frequency heating apparatus according to the embodiment of the invention and in particular showing the configuration of a portion relating to the state detection device of the high-frequency heating apparatus.
Figure 13:
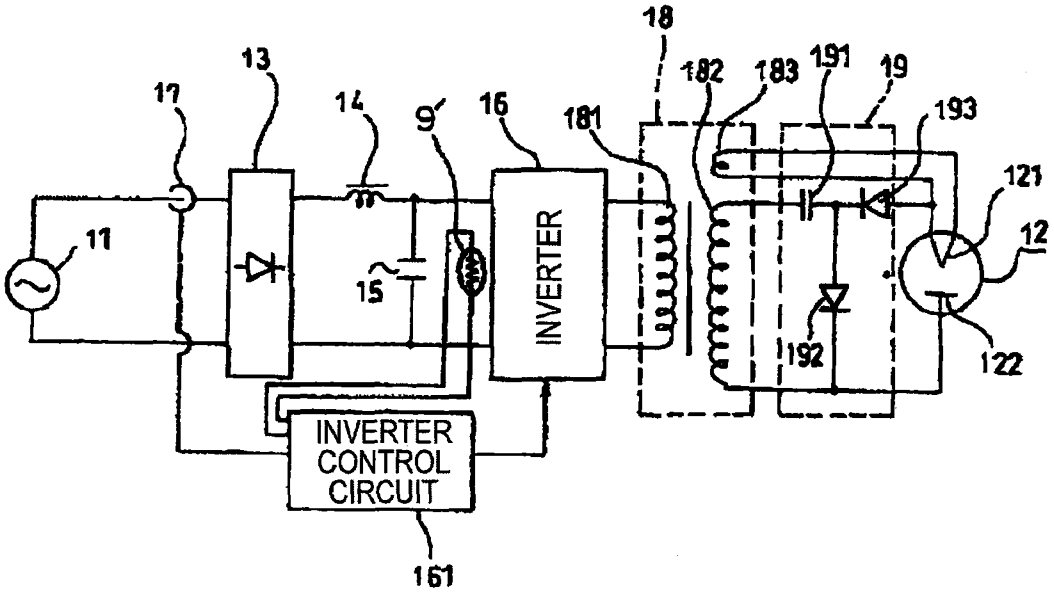
FIG. 13 A diagram showing the configuration of a high-frequency heating apparatus with a thermistor.
Figure 14A:
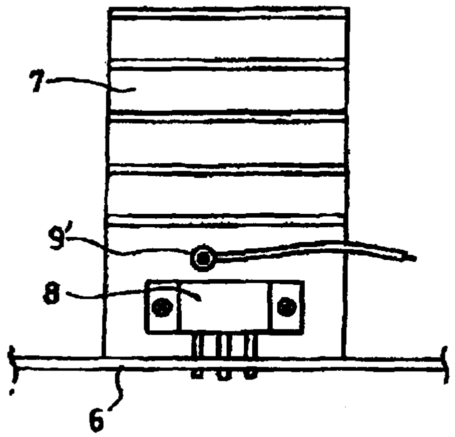
FIGS. 14A and 14B Diagrams showing a state where the thermistor is attached to a printed board and a radiation fin.
Figure 14B:
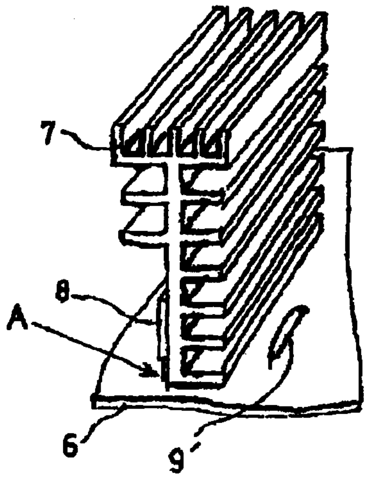

FIG. 4 is a diagram showing a high-frequency heating apparatus 100 such as a microwave oven according to this embodiment of the invention and in particular shows the configuration of a portion relating to the detection of the operating state thereof. In FIG. 4, the AC power from the commercial power supply is rectified into a DC current by a rectifying circuit, then smoothed by a smoothing circuit configured by a choke coil and a smoothing capacitor of the output side of the rectifying circuit and applied to the input side of an inverter. The DC current is converted into a current of a desired high-frequency (20 to 40 kHz) by the on/off operation of the semiconductor switching elements of the inverter. The inverter is driven by an inverter control circuit for controlling the semiconductor switching elements which switch the DC current at a high speed, whereby a current flowing in the primary side of a boosting transformer is switched in on/off states at a high speed. In the boosting transformer, a primary winding is supplied with a high-frequency voltage outputted from the inverter and so a high voltage according to the winding ratio of the transformer is obtained at the secondary winding thereof. A winding having a small number of turns is provided at the secondary side of the boosting transformer in order to heat the filament of a magnetron. The output of the boosting transformer is rectified by a full-wave voltage doubler rectifying circuit coupled to the secondary winding and then a DC high voltage is applied to the magnetron. The full-wave voltage doubler rectifying circuit is configured by two high-voltage capacitors and two high-voltage diodes. The basic configuration on the circuit board of the inverter explained above constitutes a part of the high-frequency heating apparatus according to the invention. This basic configuration is omitted in the drawing since it is same as the entire configuration shown in FIG. 13 (except for the temperature sensor 9'). That is, the omitted portion includes at least the inverter portion (including the inverter 16, the inverter control circuit 161 etc. of FIG. 13) for controlling the magnetron. The aforesaid portions are basically disposed on the circuit board of the inverter housed within the casing of the high-frequency heating apparatus.

In the configuration of FIG. 4, a detection resistor 40 for detecting an anode current serving as an anode current detection portion for detecting the anode current of the magnetron is inserted between the ground of the circuit board of the inverter and the magnetron, the cathode side of the high-voltage diode. Another element may be employed as the anode current detection portion so long as the element can detect the current following into the anode.

At the time of operating the high-frequency heating apparatus, when a high voltage is applied to the magnetron, a microwave is outputted. In this case, it is known that the anode current becomes larger as the output of the high-frequency heating apparatus increases. Further, it is known that the degree of the reflection of the microwave becomes large when a load within the heating chamber of the apparatus is small or the apparatus is in the empty heating state that a subject to be heated is not contained within the chamber. That is, by detecting the anode current flowing into the anode current detection resistor 40, the operating state of the high-frequency heating apparatus, in particular, the abnormal operating state such as the empty heating or the overheating can be recognized. Thus, the operating state of the apparatus can be controlled by inputting the current information into a microcomputer 27 on a control panel board described later.

Next, the explanation will be made as to a portion disposed on a control panel circuit board which is housed within the casing of the high-frequency heating apparatus like the inverter circuit board and is configured as a board separately provided from the inverter circuit board. The current information detected by the detection resistor 40 is transmitted from the inverter circuit board to a communication line IaDC coupled to the inverter circuit board via the connector, then smoothed by a low-pass filter which is configured by an input resistor 41 and a capacitor 29 and acts to remove high-frequency noise, and inputted to the A/D converter terminal 49 of the microcomputer 27. A resistor 43 is a surge protection resistor.

A protection resistor 23 is coupled between the output line (a part of the communication line IaDC) from the detection resistor 40 and the ground GND of the control panel circuit board, in the pre-stage of the low-pass filter. The protection resistor 23 is provided in order to prevent a high voltage from being applied to the microcomputer 27 when an abnormality (in the case of the breakage of the detection resistor 40 or non-connection to the ground) occurs on the inverter circuit board side.

Further, the microcomputer 27 is coupled to a grounding line 50 which is grounded to the main body (casing) of the high-frequency heating apparatus via metal fixing members 50*a* such as spectacle-like power plug lead wires and screws configured on the control panel circuit board. That is, there is employed a configuration that the grounding to the control panel circuit board is realized only by the grounding line 50. According to this configuration, since the path of the anode current of the magnetron as a detection subject described later becomes one, an error detection in the case where the grounding line is not coupled can be performed easily.

According to the invention, before operating the apparatus, the grounding floating of each of the inverter circuit board and the control panel circuit board is checked by using a three-state output circuit 46 contained in the microcomputer 27. The three-state output circuit 46 checks the grounding by using the voltage value obtained at the A/D converter terminal 49 as a high output by a loop configured by the anode current detection resistor 40 and the resistors 41, 42. When it is confirmed that the coupling is secured, the three-state output circuit 46 is opened and electrically separated from a series of the circuits. Then, only in the case of the normal state, a PWM output command is sent to the inverter control circuit on the inverter circuit board side via a communication line (PWM) to thereby start the operation of the inverter. On the other hand, when the occurrence of the floating is detected in at least one of the boards by the grounding check using the output of the three state output circuit, an error is displayed and the operation of the apparatus is inhibited. Another communication line OSC is a connector for receiving a signal representing the operation state of the inverter from the inverter control circuit. A portion represented by GND constitutes a coupling line to the grounding pattern of the control panel circuit board.

Further, the microcomputer 27 is coupled to a buzzer 48 which operates at a predetermined timing in accordance with a command from the microcomputer 27. Further, the microcomputer 27 is coupled to a rotary position determining portion (motion position determining portion) 80 acting as a timer which determines, in accordance with a time lapse, the rotary position, the rotary amount and the rotary speed of motors 70, 71 (FIG. 5), that is, rotary antennas 68, 69 ((FIG. 5) described later. Furthermore, the microcomputer is coupled to an operation input portion for receiving an operation input of a user. The parts may be distributed arbitrarily to the inverter circuit board and the control panel circuit board and the distribution method is not limited to the example shown in the figure.

The distribution of the respective parts to the inverter circuit board and the control panel circuit board shown in FIG. 4 and in the aforesaid description represents merely one example and the distribution method thereof does not relate to the essence of the invention. However, in general, the major driving circuits for the apparatus such as the inverter circuit and the inverter control circuit are formed on the inverter circuit board and coupled to the magnetron. The control circuit such as the microcomputer is formed on the control panel circuit board. In particular, the control circuit serves to command cooking menus when the apparatus is a microwave oven.

Figure 5:
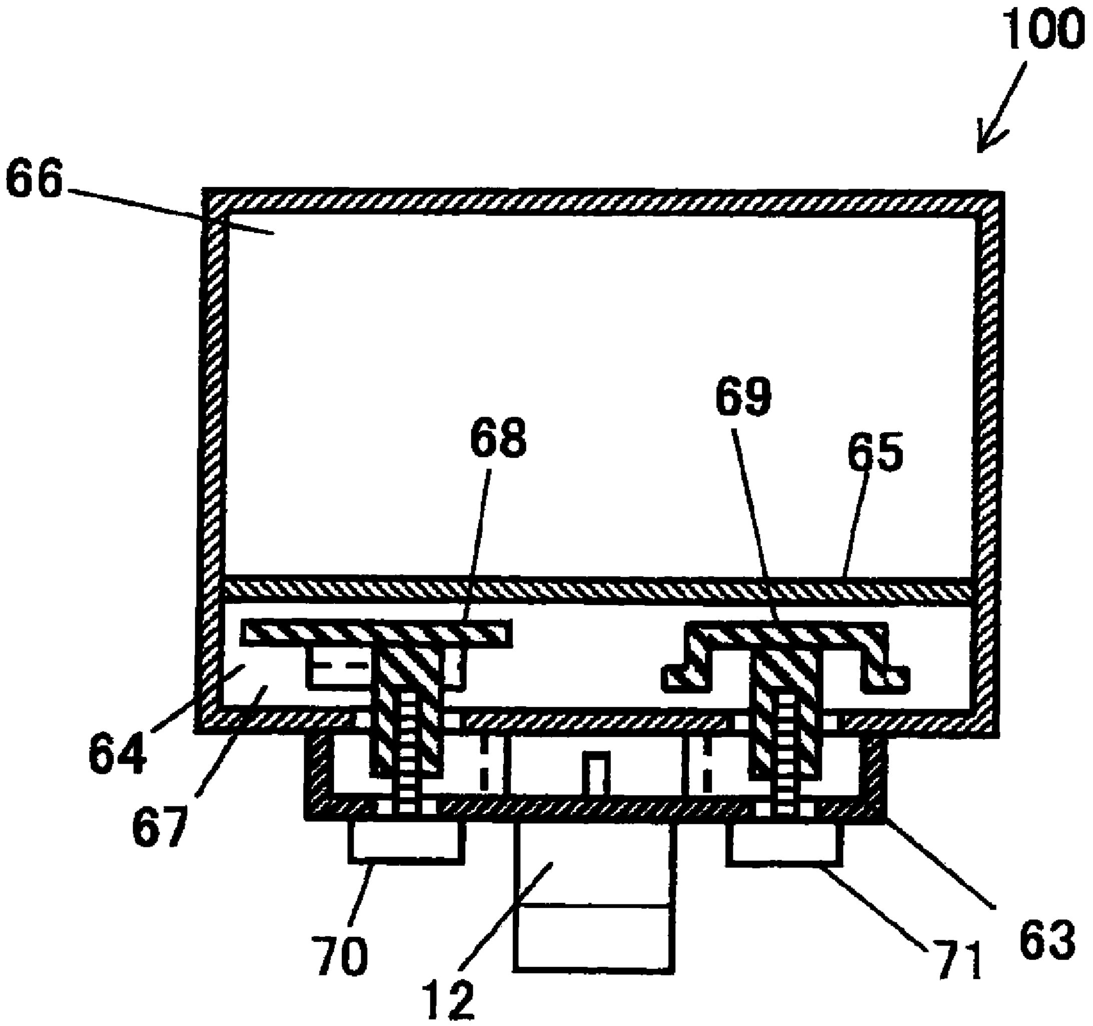
FIG. 5 A sectional diagram of the high-frequency heating apparatus according to the embodiment of the invention seen from the front side thereof.

FIG. 5 is a diagram showing the entire configuration of a high-frequency heating apparatus 100 according to the embodiment, and in particular shows a sectional diagram seen from the front side thereof. The high-frequency heating apparatus 100 includes a magnetron 12, a wave guide 63 for transmitting a microwave radiated from the magnetron 12, a heating chamber 64 coupled to the upper portion of the wave guide 63, a mounting table 65 which is fixed within the heating chamber 64 in order to place a subject to be heated such as food and has a property easily capable of transmitting the microwave since the table is formed by low-loss dielectric material such as ceramic or glass, a heated subject housing space 66 which is formed above the mounting table 65 within the heating chamber 64 and acts as a space substantially capable of housing food therein, an antenna space 67 formed beneath the mounting table 65 within the heating chamber 64, two rotary antennas 68, 69 attached symmetrically with respect to the width direction of the heating chamber 64 and motors 70, 71 serving as representative driving sources which can drive and rotate the rotary antennas 68, 69, respectively.

Although the control panel circuit board, the inverter circuit board and the parts on these boards shown in FIG. 4 are not shown in FIG. 5, these boards and the parts are of course housed within the casing of the high-frequency heating apparatus 100.

According to the invention, as described above, the operating state of the high-frequency heating apparatus can be recognized by detecting the anode current of the magnetron and the corresponding value thereof (such as the anode voltage IaDC value and also includes the anode current itself). In this respect, the current is not measured by detecting an instantaneous value thereof once but is detected for a plural number of times during a predetermined time. In addition to the formats of (1) the threshold value control and (2) the changing value detection control which are the technique for reading the anode current value as the IaDC value and determining the operating state of the high-frequency heating apparatus, it is aimed to secure the more stable detection with a higher accuracy which does not cause erroneous detection due to the influence of noise or the anode current change resulted from the change of the feeding distribution, by a reading method following a radio wave stirring member so as to intend further stability with respect to the reading of the IaDC value. Further, by employing the reading method following the radio wave stirring member, it becomes possible to execute one of (1) the threshold value control based on the number of times where the corresponding value larger than the predetermined threshold value is read continuously and (2) the changing value detection control based on the changing value of the corresponding value calculated by the readings of the plural times.

According to the invention, in order to further improve the accuracy, the corresponding value of the anode current is detected for plural times during a particular time section, whereby the aforesaid control is performed based on the total value during one section of the corresponding values during this time period.

In order to uniformly heat a heated subject such as food, in the high-frequency heating apparatus 100 according to the embodiment, the microwave radiated from the magnetron is stirred by the rotary antennas 68, 69 and irradiated on the heated subject. Such an operation means that the properties such as the shape and material of the heated subject changes with the lapse of time when seen from the microwave being irradiated, that is, the magnetron. Such the change causes the instability and fluctuation of the anode current of the magnetron. When such the fluctuation is reflected on (1) the threshold value control and (2) the changing value detection control, the operating state of the high-frequency heating apparatus may be detected erroneously. For example, when the microwave is stirred, the irradiation surface of the heated subject relatively changes abruptly and so the anode current may increase or decreases abruptly. In such a case, although the operation state is normal primarily, the microcomputer 27 erroneously determines that there arises any failure and so may stop the operation of the high-frequency heating apparatus.

Thus, according to the invention, in order to suppress the aforesaid influence due to the fluctuation, a time section where the relative change of the heated subject due to the stirring of the microwave arises is treated as a single unit time section, whereby an average value of the corresponding values of the anode current in such a time section is calculated. Further, (1) the threshold value control and (2) the changing value detection control described above are performed by treating the total sum of the average values during the one period of the radio wave stirring member as a single unit, whereby the invention realizes the configuration for suppressing the influence of the fluctuation as much as possible.

According to the invention, such a time period is obtained in a manner that the rotation of the rotary antennas 68, 69 acting as the radio wave stirring member for stirring the microwave is detected, then the average values of the respective sections are calculated in an interlocking manner with the rotary positions of the rotary antennas, and the average values are summed within the one period. That is, since the fluctuation of the feeding distribution is repeated with the period of the single rotation of the radio wave stirring member, the average values of the respective sections are calculated and the average values are summed over the one period as a single unit. As a result, according to the summed value, the instantaneous changes can be absorbed and leveled, and further the summed value is large as an absolute value and so easily treated.

Figure 6:
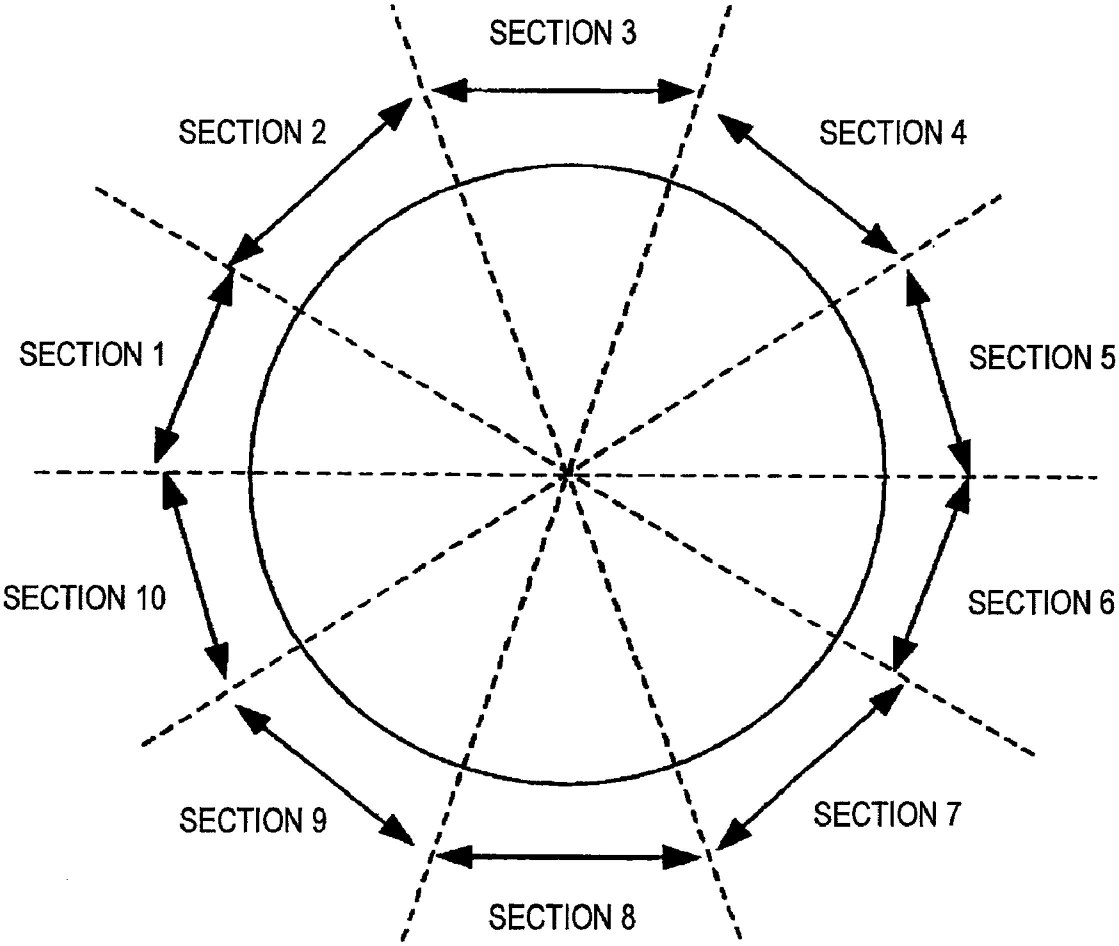
FIG. 6 A conceptional diagram showing date detection sections along a rotation locus of a rotary antenna.

An example of the concept of such a calculating processing will be shown in FIGS. 6 and 7. As shown in FIG. 6, the rotation locus representing the rotary position of the rotary antenna is equally divided into ten parts (equally divided temporally) to thereby provide ten sections of a section 1 to a section 10 (the angle of one section is 36 degree). In general, the rotary antenna is configured to rotate with 600 cycles under the condition of the AC power supply of 60 Hz, that is, to perform one revolution with a period of 600/60=10 seconds. Thus, the angular rotation time of the one section is 1 second (60 cycle). In the case of the AC power supply of 50 Hz, the rotary antenna performs one revolution with a period of 12 seconds (=600/50) and so the angular rotation time of the one section is 1.2 second (50 cycle).

The microcomputer 27 calculates the corresponding value of the anode current detected at each of the section 1 to the section 10, that is, the average value of the anode voltage IaDC values in this embodiment, at every section (calculation of the average value of the section). Then, the average values of the ten sections thus obtained are summed and the summed data is held as data of one unit. The data of one unit thus held corresponds to the summed value during one period which is the total sum of the corresponding values during one period. The section average value data collected before one period constituting the one period summed value is updated by section average value data of the section obtained at the next period to thereby generate new data of one unit.

The timing for reading the IaDC value can be performed under the time management using the rotary position determination portion 80 configured by a timer for counting an elapsed time, after starting the rotation of the motors 70, 71. The rotary position determination portion 80 can obtain, after starting the rotation of the motors 70, 71, the rotary position information (motion position information) representing the rotation position of a point in an arbitrary peripheral direction based on the elapsed time after starting the rotation. Of course, the rotary position determination portion 80 may be configured in a manner that a member to be detected (magnet etc.) is provided at the peripheral edge portion etc. of the rotary antenna to thereby read the position in the rotation direction by a sensor (magnetic sensor etc.) fixed to the wall surface etc. of the antenna space 67 (coordinate management).

In FIG. 7, the concept of the aforesaid holding and updating of data is shown by using a buffer memory as a storage device. Such the buffer memory is provided within the microcomputer 27 etc. The buffer memory includes a buffer Z for holding and updating the section average value data and a buffer X for holding and updating the one period summed value data.

Before starting the measurement, the corresponding value data of all the sections (section average value data) of the buffer Z is set as “0”. At first, the section average value data “1” of the section 1 is detected and held. Then, the section average value data “2” of the section 2 is detected and held. Similarly, the section average value data “3” to “10” of the section 3 to the section 10 are further detected and held. That is, each of these data represented by the reference numerals “1” to “10” is section average value data corresponding to the average value of all the corresponding values (data of 60 cycles in the case of 60 Hz) detected in the respective one sections.

When the section average value data of all of the section 1 to the section 10 is held, these data is summed, whereby the one period summed value data "55" of the first revolution is generated and held in the buffer X. Then, the section average value data of each of the sections in each of the second and succeeding revolutions is updated by the buffer Z. The newest one period summed value data sequentially generated by the updating is held in the buffer X. According to the embodiment, the section average value data of the section 1 held for the first time is updated by the average value data "11" of the same section in the second revolution to thereby generate new period average value data. In other words, the one period summed value data is generated when the section average value data serving as one element thereof is updated serially, that is, generated based on the section average value data held in the memory of FIFO (First-In-First-Out) format. The microcomputer 27 updates the one period summed value data held in this manner in the order of "55, 65, 75, 85 - - - ". That is, the one period summed value as the corresponding value for determining the operating state is calculated for the first time upon the lapse of 10 second in the case of 60 Hz or 12 second in the case of 50 Hz after starting the operation. Hereinafter, the one period summed value is updated serially with a time interval of 1 second in the case of 60 Hz or 1.2 second in the case of 50 Hz to thereby perform (1) the threshold value control and (2) the changing value detection control. The values of the buffer X shown in FIG. 7 are represented simply so as to help the understanding, and the degree of the fluctuation of the IaDC value at each the section of the actual feeding distribution is smaller in the actual case. The technical advantage of using the one period summed value is that the IaDC value which is small in the voltage value to be treated can be represented as a large value and it is helpful to make the detection less influenced by noise.

In this manner, according to the invention, the one revolution of the radio wave stirring member as a rotary member is calculated as the one period summed value of the corresponding values and the operation control is performed by sequentially comparing the one period summed values thus calculated. Thus, the corresponding values can be obtained stably in a state that the corresponding value having an outstanding value like noise is suppressed and the influence due to the relative relation (relative position) between the microwave and the heated subject is suppressed.

In the case of using the corresponding values obtained by the aforesaid method in (1) the threshold value control and (2) the changing value detection control, the following three methods are provided in order to suitably determine the operating state in accordance with the operating environment to be supposed (the kind and the setting condition of the heated subject, peripheral temperature) and the output.

(A) A threshold value variable control method which makes it possible to change the threshold value under the threshold value control method depending on the PWM acting as the output command of the microwave;

(B) a changing value variable control method which makes it possible to change the changing threshold value for determination under the changing value detection control method depending on the PWM acting as the output command of the microwave; and (C) a changing value determination effective time variable control method which sets a time effective for determining the changing value and makes it possible to change the time under the changing value detection control method depending on the PWM acting as the output command of the microwave.

Hereinafter, these three methods (A) to (C) will be explained sequentially.

(A) Threshold Value Variable Control Method

In general, the output of the high-frequency heating apparatus 100, that is, the output of the magnetron 12 has a feature that it can be made variable in accordance with the operation frequency and the applied voltage. The output control is performed in a manner that when a user inputs an output control signal corresponding to a desired output via the operation input portion 82, the microcomputer 27 sends the PWM (Pulse Width Modulation) output command shown in FIG. 4 to the inverter control circuit 161 on the inverter circuit board side via the communication line (PWM), whereby the inverter control circuit 161 controls the output of the inverter 16 and so the output of the magnetron 12 can be made variable. As an example, the output of the inverter 16, that is, the output of the magnetron 12 can be made variable by changing the on-duty ratio of the PWM control circuit provided within the inverter control circuit 161.

For example, there is the high-frequency heating apparatus which requires the on-duty ratio of 80% when 1,000 W output is required, the on-duty ratio of 75% when 800 W output is required, and the on-duty ratio of 65% when 700 W output is required. When there is such the relative relation, the microcomputer 27 sets a suitable threshold value in accordance with the output, that is, the PWM on-duty ratio by applying to a calculation expression such as y=Ax+B, where y represents a threshold value, x represents the PWM on-duty ratio, and A (in particular a positive value) and B represent constants. Although the calculation expression is not limited to the aforesaid one, in general an expression which threshold value y also increases in accordance with the increase of the PWM on-duty ratio x is selected (y is the quadric etc. of x).

Figure 8:
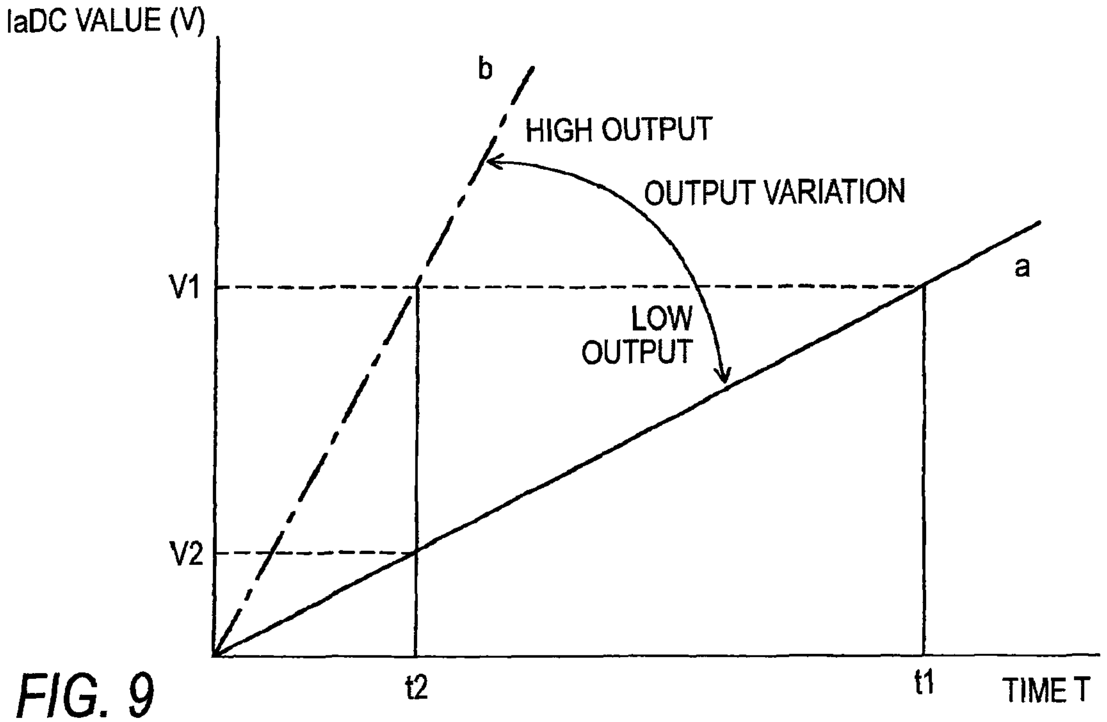
FIG. 8 A graph showing the change of the anode voltage with a time lapse.

A time required for detecting the empty heating can be made short by separately providing the threshold value as the limit value according to each of the respective outputs like the aforesaid expressions. That is, as shown in FIG. 8, in the case of the low output, the voltage of the anode current corresponding value (IaDC value) unlikely increases with the lapse of time as shown by a straight line a. In contrast, in the case of the high output, the IaDC value likely increases with the lapse of time as shown by a straight line b. Under such a condition, when the threshold voltage as the threshold value is set to be a constant fixed value V1, the detection voltage reaches the threshold voltage V1 in a relatively short time of t2 in the case of the straight line b. However, in the case of the straight line a where the output is reduced, a time required for the detected voltage to reach the threshold voltage V1 becomes a long time of t1, and so a long time is required for the detection.

Thus, according to the present method, in the case of the low output shown by the straight line a, a lower threshold value V2 is calculated separately by using the aforesaid calculation expression etc. and the threshold value control is performed by using this threshold value. According to such a control method, in the case of the low output, such phenomena can be more surely prevented from occurring that a long time is required for the detection and that a trouble such as the empty heating arises continuously since the detected voltage does not reach the threshold set value V1 as the conventional fixed value.

Further, even in the case of also employing (2) the changing value detection control, since the changing value is small as shown by the straight line a, of FIG. 8 in the case of the low output, the detection may be difficult. Accordingly, when the present method is employed in the case of cooking with a low output during a long time, a trouble such as the empty heating can be more surely prevented from occurring continuously.

Further, when the output is variable, the fixed single threshold voltage is inevitably required to be matched to the maximum output such as 1,000 W (V1 of FIG. 8). However, in the case of the low output such as 600 W, when the empty heating state occurs continuously until the detected value-reaches V1 (until the time reaches t1), it is dangerous since the operation is continued until the time reaches t1 or the cooking completes. When the low threshold value suitable for the low output is set in advance like the present method, the operation in the empty heating state can be prevented from being continued.

(B) Changing Value Variable Control Method

In this method, the microcomputer 27 changes the changing threshold value for determination in accordance with the output (PWM on-duty ratio) to set a suitable changing value of the changing threshold value for determination in accordance with the output. As a calculation expression, an expression similar to the aforesaid one for the threshold value variable control method is employed.

This method can also cope with the difference of the changing value according to the change of the environment of the magnetron. For example, the following two situations are supposed.

Situation 1: environmental temperature is 35 degree centigrade, the heating apparatus is incorporated within the casing, a water load exists (the heated subject is water), and the output is 1,000 W.

Situation 2: environmental temperature is 0 degree centigrade, an open space, no water load (empty heating), and the output is 600 W.

Under the situation 1, it is found that the changing value (a degree of the slope) of the IaDC value becomes larger than that under the situation 2. Thus, when a value larger than the changing value under the situation 1 is set as the changing threshold value for determination, the empty heating under the situation 2 can not be detected. Thus, according to this method, the changing threshold value for determination according to the output (the changing threshold value for the low determination according to a low output) is set, whereby the empty heating under the situation 2 can also be detected and so the continuation of the operation can be prevented.

(C) Changing Value Determination Effective Time Variable Control Method

According to this method, the microcomputer 27 changes an effective determination time for continuing the determination of the changing value detection in accordance with the output (PWM on-duty ratio). The time is obtained by using such an expression of $y=-Ax+B$, where y represents the effective determination time, x represents the PWM on-duty ratio, and A (in particular a positive) and B represent constants. Although the calculation expression is not limited to the aforesaid one, an expressing is generally selected which effective determination time y reduces in accordance with the increase of the PWM on-duty ratio x (y is inversely proportional to x, for example).

Figure 9:
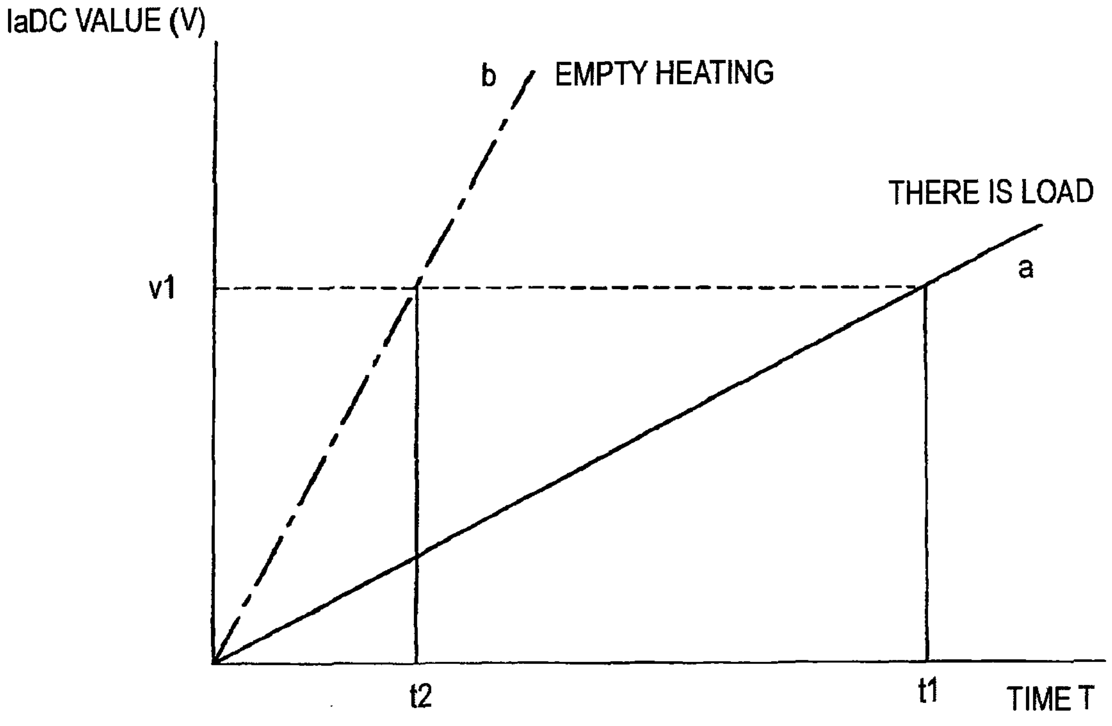
FIG. 9 A graph showing the change of a changing value of the anode voltage with a time lapse.

That is, as shown by a straight line a in FIG. 9, it is found that even if there is a (water) load, the changing value of the IaDC value (degree of the slope) becomes large when the apparatus is driven for a long time (in particular, at the time of the operation under the situation 1). Thus, when the changing threshold value for determination as a single fixed value Δv1 (the changing value of the IaDC value from the start of the operation) is determined in advance, even if a load exists, the microcomputer 27 determines that the changing value reaches the predetermined changing threshold value for determination Δv1 when the time reaches t1 to thereby perform a processing such as the stop of the operation or the reduction of the output which is performed when the operating state is determined to be abnormal.

Thus, according to this method, an effective determination time limit (upper limit) t2 for the changing value (slope) determination in the changing value control method is set. Further, the effective determination time, during which the changing value determination is effective, is calculated in advance by a value depending on PWM acting as the output command of the microwave. The changing value determination is made effective until the time reaches t2 after the start of the operation but thereafter the changing value determination is not performed (even of the changing value reaches the changing threshold value for determination Δv1 after the effective determination time t2, the processing performed when the operating state is determined to be abnormal is not performed). That is, since the effective determination time is changed at every output based on the aforesaid expression, it becomes possible to more quickly and more surely determine the various kinds of the operating states as to the combinations of the microwave output and the load existing state or the empty heating state. To be concrete, the determining time is made smaller as the output increases to thereby prevent an erroneous detection that the state is determined as the empty heating despite that a load exists.

Third Embodiment

According to the second embodiment, the corresponding value of the anode current is detected during a time section of one revolution of the radio wave stirring member as a rotary member. According to this embodiment, irrespective of the particular time section of one revolution of the radio wave stirring member, in the case of using (1) the threshold value control or (2) the changing value detection control, the threshold value of the control (1) or (2) is changed in accordance with the output (output control signal) of the high-frequency heating apparatus. In other words, each of the threshold values can be changed in accordance with an arbitrary time and an arbitrary detection number. In this case, like the aforesaid embodiment, the aforesaid three methods (A) to (C) can be used.

That is, in this embodiment, each of the detection of the rotation of the rotary antennas 68, 69 and the calculation of the IaDC value at each section explained with reference to FIGS. 6 and 7 in the second embodiment is performed optionally. To be concrete, although the microcomputer 27 calculates the operating state of the high-frequency heating apparatus 100 based on the anode current of the magnetron, the microcomputer determines the operating state at a timing and during a time period each being completely independent from the rotation of the rotary antennas 68, 69. The microcomputer 27 changes the threshold value to a suitable value based on one of (A) the threshold value variable control method, (B) the changing value variable control method and (C) the changing value determination effective time variable control method.

The explanation will be made with reference to a flowchart shown in FIG. 10 as to the operation at the time of detecting the operating state of the high-frequency heating apparatus thus configured, in particular, at the time of detecting an abnormality in the operating state when the apparatus is a microwave oven and the operation of the protecting processing at the time of detecting the abnormality.

The microcomputer 27 sets m=0 and Z(m)=Zmin=500 as the initial setting for the high-frequency heating apparatus (step S201). The meanings of the respective signs are as follows.

m: the order where the total sum during the one period of the anode voltage IaDC values is calculated;

Z(m): the total sum during the one period of the anode voltage IaDC values calculated at the m-th time; and Zmin: store an initial value for comparison used for the changing value control.

Although Z(m) is the total sum during the one period calculated from the read IaDC values, it is set to be 500 as the initial value at the beginning of the operation. That is, Z(0) =500. Further, Zmin, which is used as the initial value for comparison at the time of measuring the changing value used for the changing value control, is also set to 500 as the initial setting.

Subsequently, the microcomputer 27 reads the output control signal generated in accordance with the operation output (1,000 W, 800 W, 700 W etc.) set by a user at the operation input portion 82 provided at the casing of the high-frequency heating apparatus (step S202), and applies the signal to the relation expressions shown in the threshold control and the changing value detection control to thereby calculate the threshold value A, the changing value threshold value C and the changing value determination effective time T (step S203).

Then, the microcomputer 27 sends the PWM command to the inverter control circuit via the PWM communication line to thereby drive the magnetron and oscillate the microwave, whereby the operating state monitoring sequence starts based on the checking of the anode current and the anode voltage (step S204).

Next, the anode current read by the anode current detection resistor 40 is inputted into the A/D converter terminal 49 of the microcomputer 27 constituting the anode current input portion and subjected to the analog-to-digital conversion. Then, the corresponding anode voltage IaDC values are read, then the section average value and the summed value during one period are calculated in accordance with the processings shown in FIGS. 6 and 7, and these values are stored in the buffer memory (step S205). The conversion from the current to the voltage is obtained in view of the resistance value of the anode current detection resistor 40 according to the normal method.

Next, the changing value detection control for detecting the changing value of the IaDC value is performed. First, the microcomputer 27 obtains the number of times where the summed value during one period of the anode voltage IaDC values used for the changing value detection control is detected, that is, a value of the counter where 1 is added to m representing the order where the total sum during the one period of the anode voltage IaDC values is calculated (step S206). Then, the summed value Z(m) during one period calculated at this timing is written into the buffer memory (step S207). Subsequently, Zmin used as the initial value for comparison is set. The m-th value of the summed value Z(m) during one period continuously updated is compared with the (m−1)-th value thereof. When the m-th value is smaller than the (m−1)-th value, Zmin is set again (step S209). When the m-th value is equal to or larger than the (m−1)-th value, the process proceeds to the next step (No in step S208). Then, the microcomputer 27 determines whether or not a time elapsed from the start of the measurement exceeds the changing value determination effective time T calculated in step S203. When the elapsed time does not exceed the effective time T (No in step S210), it is determined whether or not a changing value Z(m)−Zmin representing the difference between the value Z(m) and the initial value Zmin for comparison exceeds the threshold value C (calculated in step S203) of the changing value in the changing value detection control (step S211). In contrast, when the elapsed time exceeds the changing value determination effective time T (Yes in step S210), the process jumps to the processing (the threshold value control) of step S213 and the succeeding steps. In step S211, when the changing value Z(m)−Zmin is larger the threshold value C, that is, Z(m)−Zmin≧C (No in step S211), the microcomputer 27 determines that there arises any abnormality, then stops the apparatus or reduces the output and displays an error via the liquid crystal panel etc. of the casing (step S212). On the other hand, when the changing value does not exceed the changing value threshold value C (Yes in step S211), the processing (the threshold value control) of step S213 and the succeeding steps is started.

Subsequently, the summed value Z(m) during one period at the present time is compared with the threshold value A (calculated in step S203) to determine whether or not the summed value is smaller than the threshold value A (step S213). As the result of the determination in step S213, when it is determined that the calculated Z(m) is larger than the threshold value A (No in step S213), the microcomputer 27 determines that there arises any abnormality, then stops the apparatus or reduces the output of the apparatus and displays an error via the liquid crystal panel etc. provided at the casing of the apparatus (step S212).

As the result of the determination in step S213, when it is determined that the summed value Z(m) during one period is equal to or smaller than the threshold value A (Yes in step S213), it is determined whether or not the cooking is completed (the stop key is pressed or not) (step S214). When it is determined that the cooking is completed (Yes in step S214), the cooking is terminated. When it is not determined that the cooking is completed (No in step S214), the process returns to step S205 and the anode voltage value IaDC is read again. Then, the summed value Z(m) during one period is calculated and the succeeding processing is executed.

According to the invention, the stop of the apparatus or the control of the output is not performed only depending on the read value of the anode voltage IaDC value at a certain moment (only one check). The microcomputer 27 executes the continuous detecting processing of the IaDC values. When it is detected continuously for a predetermined number of times or more that the IaDC value exceeds the threshold value A or when the changing value of the IaDC value exceeds the predetermined value, the microcomputer stops the high-frequency heating apparatus or reduces the output thereof. Since the aforesaid operation is not depending on only the momentary detection, the probability of the erroneous detection due to noise can be reduced and so the detection operation can be performed more accurately.

Further, according to the invention, in addition to the plural times of the detection of the IaDC value, the average value of the IaDC values is calculated over the predetermined section. Further, since the summed value of the average values during one period of the radio wave stirring member is used for determining the operating state in order to cope with the change of the feeding distribution, the determination can be made accurately without causing erroneous detection.

As described above, this embodiment employs the two control methods as the method of detecting the operating state, that is, the threshold value control using the threshold value A as the absolute value of the voltage and the changing value detection control for detecting the changing value of the predetermined time of the voltage. In FIG. 10, the determination of step S208 and the succeeding steps corresponds to the changing value detection control, and the determination of step S213 and the succeeding steps corresponds to the threshold control. Each of these control methods is executed by the determination portion which is contained in the microcomputer 27 and constituted by various kinds of the arithmetic processing devices. The microcomputer 27 including the determination portion and the A/D converter terminal 49 constituting the anode current input portion corresponds to the state detection device according to the invention. Of course, the determination portion and the anode current input portion are not necessarily constituted as a single chip integrally.

In the aforesaid embodiment, although the two methods, that is, the threshold value control and the changing value detection control are used together, these two methods may be executed independently. For example, the high-frequency heating apparatus can be controlled only by the changing value detection control in a manner that after the changing value detection control from step S208 to step S211 of FIG. 10, the determination of step S214 is executed without executing step S213. Alternatively, the high-frequency heating apparatus can be controlled only by the threshold value control by performing the determination of step S213 without executing steps S208 to step S211.

Figure 10:
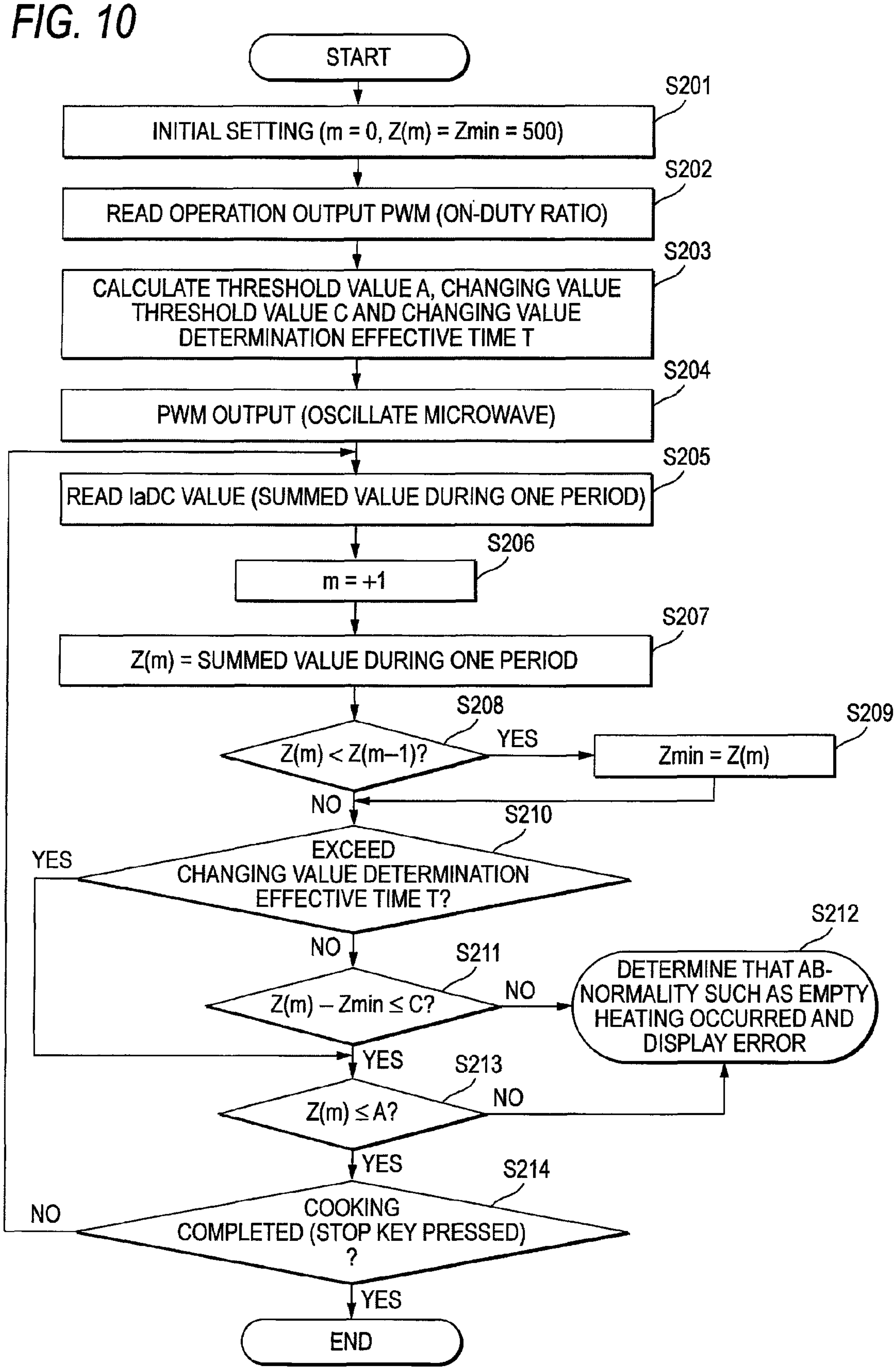
FIG. 10 A flowchart of the processing of the state detection device.

Further, the operation of FIG. 10 conforms to the explanation of the second embodiment. However, in the case of the third embodiment, it is not necessary to detect the one period of the rotary antennas 68, 69 nor to control the threshold value at each period. Thus, in the third embodiment, it is not necessary to calculate the total sum value during one period in step S205 but it is merely required to perform the operation in step S207 and the succeeding steps based on the summed value at each suitable timing.

Further, when it is determined that the operating state is abnormal by the threshold value control and/or the continuous detection control, an alarm may be sounded by the buzzer 48 shown in FIG. 4 together with the stop of the operation or the reduction of the output or in place of the stop of the operation or the reduction of the output. The sound of the buzzer may be changed between the empty heating operation and the small heating load operation.

In the case of reducing the output of the high-frequency heating apparatus, it is desirable to reduce the output to 50% or less of the maximum output thereof. Only in view of the protection of the high-voltage diode of the full-wave voltage doubler rectifying circuit, the output may be restored to the normal 100% output when the anode voltage value IaDC or the calculated summed value during one period reduces to the current smaller than the threshold value A again, for example.

Figure 11:
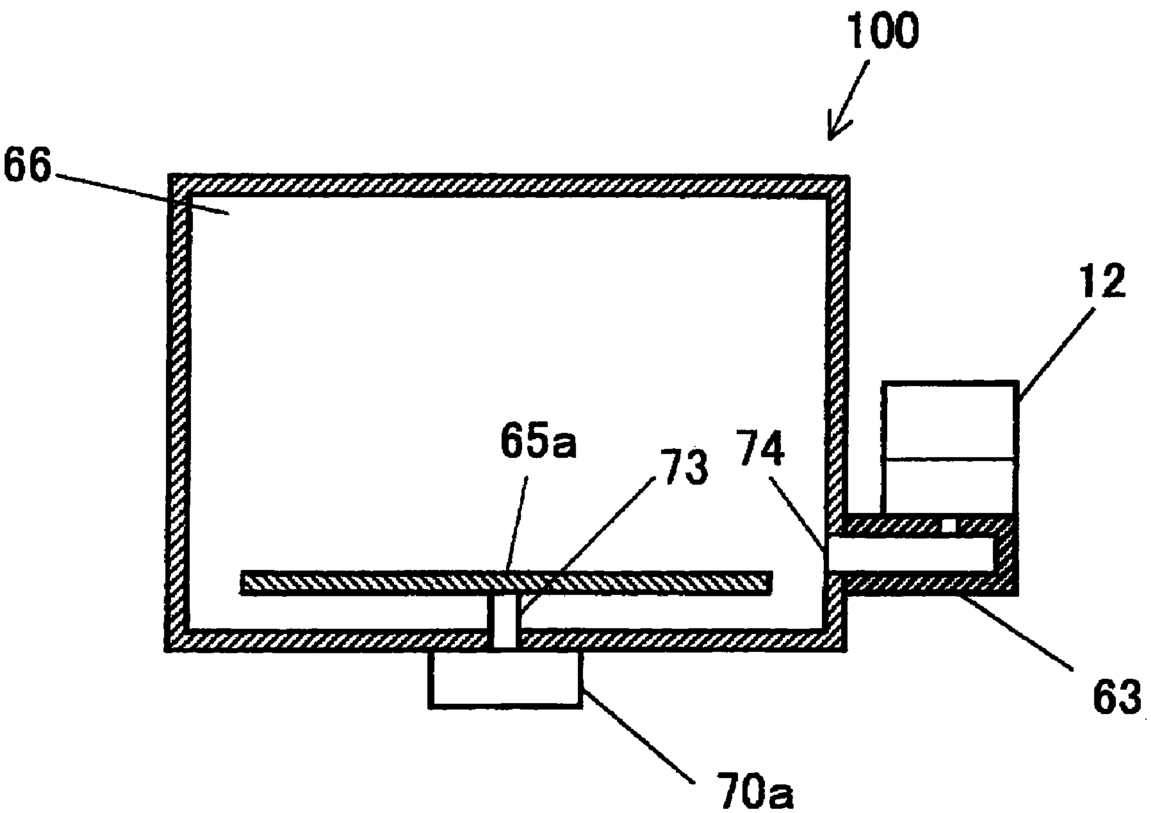
FIG. 11 A sectional diagram of the high-frequency heating apparatus according to another embodiment of the invention seen from the front side thereof.

FIG. 11 is a sectional diagram of the high-frequency heating apparatus 100 seen from the front side thereof according to another embodiment of the invention. In the high-frequency heating apparatus 100 according to the embodiment, the two rotary antennas 68, 69 as shown in FIG. 5 are not used. According to the embodiment, a mounting table 65*a* is a turn table which is driven and rotated by a motor 70*a* via a shaft 73. The heating chamber 64 is provided with an opening 74, whereby the microwave generated from the magnetron 12 is conducted to the heated subject housing space 66 via the wave guide 63 and the opening 74. A heated subject which is placed on and rotated by the mounting table (turn table) 65*a* is heated by the microwave. According to the embodiment, the effects similar to that of the embodiment of FIG. 5 is attained by detecting the rotary position of the motor 70*a*, calculating the summed value of one period of the turn table as described above and performing the control. Thus, according to the embodiment, although the mounting table does not stir the microwave itself unlike the rotary antennas 68, 69 as shown in FIG. 5, the mounting table (turn table) 65*a* stirs the microwave relatively when seen from a heated subject and so also acts as the radio wave stirring member.

Figure 12:
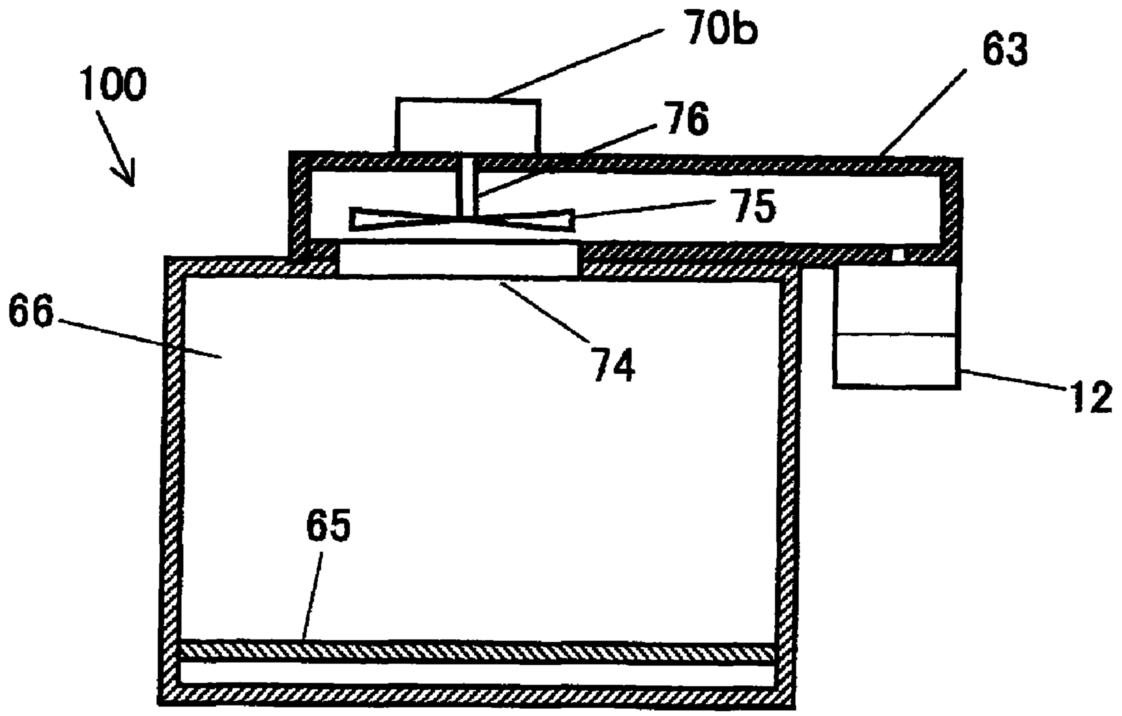
FIG. 12 A sectional diagram of the high-frequency heating apparatus according to still another embodiment of the invention seen from the front side thereof.

FIG. 12 is a sectional diagram of the high-frequency heating apparatus 100 seen from the front side thereof according to still another embodiment of the invention. In the high-frequency heating apparatus 100 according to the embodiment, the two rotary antennas 68, 69 housed in the antenna space 67 as shown in FIG. 5 are not used. According to the embodiment, a radio wave diffusion blade 75 provided at the upper portion of the heated subject housing space 66 is driven and rotated by a motor 70*b* via a shaft 76. The heating chamber 64 is provided with an opening 74, whereby the microwave generated from the magnetron 12 is conducted to the radio wave diffusion blade 75 being rotated via the wave guide 63, then diffused thereby and conducted to the heated subject housing space 66 via the opening 74. A heated subject which is placed on the mounting table 65 is heated by the microwave. According to the embodiment, the effects similar to that of the embodiment of FIG. 5 is attained by detecting the rotary position of the motor 70*b*, calculating the summed value of one period of the turn table as described above and performing the control.

The aforesaid embodiments show the example where the radio wave stirring member itself rotates around the predetermined point. However, the radio wave stirring member to which the invention is applied is not limited to such a configuration. The invention can be applied to the high-frequency heating apparatus having a radio wave stirring member which moves with a predetermined temporal and orbital period. This is because it becomes possible to suppress the fluctuation of a value for determination by relating the period with the detection of the anode current.

Further, in the aforesaid embodiments, although the average value of the section and the summed value during one period of the corresponding values of the current such as the anode voltage are used as the discrimination value of the operating state, it is not necessary to use all the corresponding values thus detected for the summed value in the strict sense. It is sufficient to obtain a value which is representative of a plurality of corresponding values during one period and is suitable for discriminating the operation state.

This application is based on Japanese Patent Application No. 2005-372662 filed on Dec. 26, 2005, Japanese Patent Application No. 2006-169051 filed on Jun. 19, 2006 and Japanese Patent Application No. 2006-169053 filed on Jun. 19, 2006, the contents thereof are incorporated herein by reference.

Although various embodiments of the invention are explained above, the invention is not limited to the matters shown in the aforesaid embodiments. The invention intends that a technical matter obtained from those skilled in the art by changing and applying the invention based on the description of the specification and the well known techniques is contained as a scope to be protected.

INDUSTRIAL APPLICABILITY

As described above, according to the invention, it becomes possible to be hardly influenced by noise and detect abnormality of the anode current of high accuracy, and also becomes possible to control with a higher accuracy, operate safely and protect the high-frequency heating apparatus. Further, it becomes possible to also flexibly cope with the change of the corresponding value of the anode current of the magnetron due to the combination of a different radio wave output, a different setting condition, a different heated subject, a different environmental temperature etc. to thereby make it possible to detect the abnormality of the anode current of high accuracy, and also make it possible to control with a higher accuracy, operate safely and protect the high-frequency heating apparatus.

FIG. 1

27 microcomputer
inverter circuit board
control panel circuit board

FIG. 2

S100 initial setting (n=0, m=0, k=0, Z(m)=1.2)
S101 PWM output (oscillate microwave)
S102 read IaDC
S106 determine abnormality such as empty heating (error display)
S114 cooking completed (stop key pressed)?

FIG. 3 voltage V
time T

FIG. 4

27 microcomputer
inverter circuit board
control panel circuit board

FIG. 6 section 1 - - - section 10

FIG. 7 buffer Z
section 1 - - - section 10
updated content
first revolution
section 1 - - - section 10
second revolution
section 1 - - - section 3
butter X

FIG. 8

IaDC value
high output
output variation
low output
time T

FIG. 9

IaDC value
empty heating
there is load
time T

FIG. 10

S200 initial setting (m=0, Z(m)=Zmin=500)
S202 read operation output PWM (on-duty ratio)
S203 calculate threshold value A, changing value threshold value C and changing value determination effective time T
S204 PWM output (oscillate microwave)
S205 read IaDC value (summed value during one period)
S207 Z(m)=summed value during one period
S210 exceed changing value determination effective time T?
S212 determine that abnormality such as empty heating occurred and display error
S214 cooking completed (stop key pressed)?
cooking completed

FIG. 13

16 inverter
161 inverter control circuit

The invention claimed is:

1. A state detection device for detecting an operating state of a high-frequency heating apparatus including a magnetron for generating microwave; comprising:

an anode current input portion which inputs a detected anode current of the magnetron; and a determination portion which reads a corresponding value corresponding to the anode current inputted by the anode current input portion for a plurality of times during a predetermined time period and determines the operating state of the high-frequency heating apparatus based on a plurality of the corresponding values, wherein the determination portion determines the operating state of the high-frequency heating apparatus based on (1) a threshold value control based on a number of times where the corresponding value larger than a predetermined threshold value is read continuously and/or (2) a changing value detection control based on a changing value per unit time of the corresponding value calculated by the reading of plural times.

2. A state detection device according to claim 1, wherein when the number of times reaches a predetermined number of times or more in (1) the threshold value control or when the changing value exceeding a predetermined threshold value is calculated for a predetermined number of times or more in (2) the changing value detection control, the determination portion determines that the operating state of the high-frequency heating apparatus is not normal to thereby stop an operation of the high-frequency heating apparatus or reduce an output thereof.

3. A state detection device according to claim 1, wherein the anode current input portion is constituted by an A/D converter terminal which subjects an anode voltage that is the corresponding value to an analog-to-digital conversion.

4. A state detection device according to claim 1, wherein the determination portion determines whether the operating state of the high-frequency heating apparatus is a normal state, an empty heating state or an overheating state by a load based on the changing value under (2) the changing value detection control.

5. A state detection device according to claim 4, further comprising a buzzer which warms the empty heating state and the overheating state by different buzzer sounds, respectively.

6. A state detection device according to claim 1, wherein (2) the changing value detection control is performed when the number of times does not exceed the predetermined number of times in (1) the threshold value control.

7. A high-frequency heating apparatus, comprising:

the magnetron, an anode current detection portion which detects the anode current, an inverter portion which controls the magnetron, and the state detection device according to claim 1.

8. A high-frequency heating apparatus according to claim 7, wherein the anode current detection portion is configured by an anode current detection resistor which is disposed in a path for grounding the inverter portion.

9. A high-frequency heating apparatus according to claim 7, wherein the state detection device outputs a command for making the anode current constant to the inverter portion when the state detection device is determined that the operating state of the high-frequency heating apparatus is not normal.

10. A state detection method for detecting an operating state of a high-frequency heating apparatus including a magnetron for generating microwave; comprising:

a step of inputting a detected anode current of the magnetron; and a step of reading a corresponding value corresponding to the anode current thus inputted for a plurality of times during a predetermined time period and determining the operating state of the high-frequency heating apparatus based on a plurality of the corresponding values, wherein the determination step determines the operating state of the high-frequency heating apparatus based on at least one of (1) a threshold value control based on a number of times where the corresponding value larger than a predetermined threshold value is read continuously and (2) a changing value detection control based on a changing value per unit time of the corresponding value calculated by the reading of a plural times.

* * * * *

UNITED STATES PATENT AND TRADEMARK OFFICE

CERTIFICATE OF CORRECTION

PATENT NO. : 7,863,887 B2
APPLICATION NO. : 12/159012
DATED : January 4, 2011
INVENTOR(S) : Hideaki Moriya et al.

It is certified that error appears in the above-identified patent and that said Letters Patent is hereby corrected as shown below:

On the title page, item [75] "Inventors", change the third inventor's name from Hauo Suenaga to Haruo Suenaga.

In column 9, line 65, delete "1 A" and instead insert --1A--.

In column 27, delete lines 5 through 60 beginning with "FIG. 1" and up through "161 inverter control circuit".

Signed and Sealed this
Nineteenth Day of April, 2011

David J. Kappos

David J. Kappos
*Director of the United States Patent and Trademark Office*